(12) United States Patent
Sato et al.

(10) Patent No.: US 6,569,595 B1
(45) Date of Patent: May 27, 2003

(54) METHOD OF FORMING A PATTERN

(75) Inventors: Yasuhiko Sato, Yokohama (JP); Eishi Shiobara, Inagi (JP); Yasunobu Onishi, Yokohama (JP); Shuji Hayase, Yokohama (JP); Yoshihiko Nakano, Tokyo (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/512,286

(22) Filed: Feb. 24, 2000

(30) Foreign Application Priority Data

Feb. 25, 1999 (JP) .......................................... 11-048333

(51) Int. Cl.$^7$ ................................................ G03F 7/00
(52) U.S. Cl. ...................... 430/270.1; 430/314; 430/316
(58) Field of Search ............................. 430/270.1, 314, 430/316

(56) References Cited

U.S. PATENT DOCUMENTS

| | | | | |
|---|---|---|---|---|
| 4,575,399 A | * | 3/1986 | Tanaka et al. ............ | 156/272.8 |
| 5,557,534 A | * | 9/1996 | Wu .............................. | 364/491 |
| 5,652,297 A | * | 7/1997 | McCulloch et al. ......... | 524/555 |
| 5,733,712 A | * | 3/1998 | Tanaka et al. ............... | 430/314 |
| 5,733,714 A | * | 3/1998 | McCulloch et al. ......... | 430/325 |
| 5,759,746 A | | 6/1998 | Azuma et al. | |
| 5,871,672 A | * | 2/1999 | Murphy et al. .............. | 252/514 |
| 5,939,485 A | * | 8/1999 | Bromberg et al. .......... | 524/556 |
| 6,228,919 B1 | * | 5/2000 | Sommerfeld ................ | 524/361 |
| 6,136,511 A | * | 10/2000 | Reinberg et al. ............ | 430/313 |
| 6,251,562 B1 | * | 6/2001 | Bretya et al. ............. | 430/287.1 |

FOREIGN PATENT DOCUMENTS

| JP | 8-241858 | | 9/1996 |
|---|---|---|---|
| JP | 2000-239537 | * | 5/2000 |

* cited by examiner

Primary Examiner—Janet Baxter
Assistant Examiner—Amanda C. Walke

(57) ABSTRACT

A method of forming a pattern which comprises the steps of, forming a matrix pattern on a work film, filling an opened space in the matrix pattern with a mask material layer containing at least one kind of a network carbon polymer having a repeating unit represented by the following general formulas (CP1) to (CP4) on the work film, forming a mask material pattern by removing the matrix pattern, and forming a work film pattern by transferring the mask material pattern to the work film:

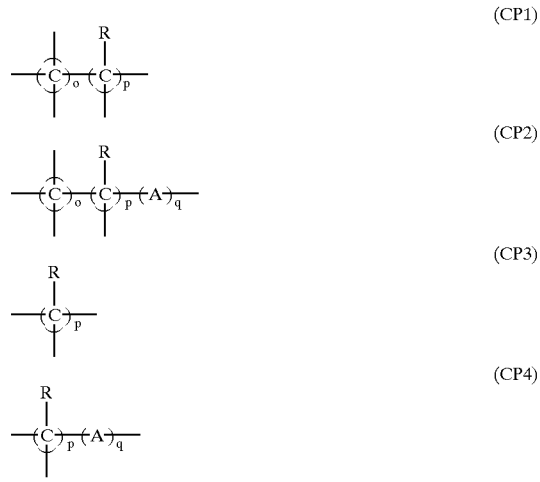

wherein R is halogen atom, hydrogen atom or a substituted or unsubstituted hydrocarbon group, A is a polyvalent organic group, and m, n and k denote respectively a positive integer.

10 Claims, 18 Drawing Sheets

METHOD OF FORMING A PATTERN

CROSS-REFERENCE TO RELATED APPLICATION

This application is based upon and claims the benefit of priority from the prior Japanese Patent Application No. 11-048333, filed Feb. 25, 1999, the entire contents of which are incorporated herein by reference.

BACKGROUND OF THE INVENTION

This invention relates to a method of manufacturing a semiconductor device, in particular, to a working method of a thin film such as an interlayer insulating film or a metallic wiring layer.

The manufacturing method of a semiconductor device generally involves the steps of depositing a plurality of layers comprising a plurality of materials on a semiconductor wafer, and patterning each of these deposited thin films into a desired pattern. This patterning step of thin films or a work film (a film to be worked or processed) is generally performed as follows. Namely, at first, a photosensitive material called resist in general is deposited on a work film formed on the surface of wafer to form a resist film. Thereafter, a predetermined region of the resist film is selectively exposed and then subjected to a developing process to remove the exposed or unexposed region of the resist film, thereby forming a resist pattern. Subsequently, the work film formed in advance on the substrate is dry-etched using this resist pattern as an etching mask, thereby forming a desired pattern of the work film.

It is demanded, in view of ensuring desired resolution, light exposure tolerance or focus tolerance at the time of patterning exposure, to make the film thickness of the resist film as thin as possible. As a result, it is now very difficult to secure a sufficient film thickness of the resist film to perform the etching of the work film.

In order to overcome this problem, there has been adopted a method wherein a mask material which is more resistive to etching than the resist is deposited on surface of a work film, and then, the resist pattern formed in advance is successively transferred to the mask film and then to the work film.

The mask material that has been conventionally employed includes, as the dry type that can be employed in a dry method, a metal film such as aluminum and a carbon film; and as the wet type that can be employed in a wet method, polysilane or an organic resin such as novolak resin and polyhydroxystyrene. Among them, the metal film and carbon film that can be formed in a dry method are disadvantageous in view of high manufacturing cost since a vacuum system is required in the deposition thereof. With respect to the materials to be employed in a wet method in the deposition thereof, polysilane is accompanied with the problem that since it contains an inorganic atom in its molecule, it is difficult to strip a residual mask material pattern that has been left after the working of a work film. In the case of the organic resin on the other hand, it is also accompanied with the problem that the etching resistance thereof is almost the same as that of the resist.

In the meantime, Japanese Patent Unexamined Publication H8-241858 discloses an anti-reflective film composed of an organic resin in which carbon particles are dispersed. According to the method disclosed therein, carbon particles are dispersed at first in an organic solvent to obtain a mixture, which is then coated on the surface of a wafer substrate, thereby forming an anti-reflective film. In this case, since carbon particles are not dissolved in the organic solvent, carbon particles may be precipitated on the surface of film of coating, thus making it difficult to obtain an excellent coating property. Further, according to this publication, carbon particles are dispersed in an organic resin with a view to improve the light absorbency at a wavelength of 248 nm used as an exposure light and, to inhibit the reflection of light from the underlying substrate by means of this thin anti-reflective film. It is required however, for the purpose of achieving an absorbency which is as possible as high at the ultraviolet region, to employ carbon particles which involve a π-orbit at carbon-carbon bond. However, the inclusion of this π-orbit leads to an increase of absorbency even to an alignment light, thus preventing the alignment light from passing through the mask material. As a result, it becomes difficult to detect an underlying pattern formed in advance on an underlying substrate.

As explained above, a mask material which is suited for use in the manufacture of a semiconductor device is not yet available at present.

BRIEF SUMMARY OF THE INVENTION

Therefore, an object of the present invention is to provide a method of forming a pattern, which enables a work film to be worked while assuring an excellent anisotropic etching of the work film even if the film thickness of a resist film is reduced, by using a mask material which can be normally coated in a wet method, has a sufficient etching resistance and is capable of being removed by means of an ashing treatment.

Another object of the present invention is to provide a method of forming a pattern, which employs a mask material which is excellent in transparency to an alignment light, thereby making it possible to realize a high precision alignment in relative to an underlying pattern.

Namely, this invention provides a method of forming a pattern, which comprises the steps of;

forming a mask material layer on a work film by coating a solution containing at least one kind of a network carbon polymer having a repeating unit represented by the following general formulas (CP1) to (CP4) on the work film;

forming a resist film on the mask material layer;

forming a resist pattern by exposing the resist film to a patterning exposure light and by developing the exposed resist film;

forming a mask material pattern by transferring the resist pattern to the mask material film; and forming a work film pattern by transferring the mask material pattern to the work film:

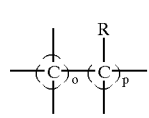

(CP1)

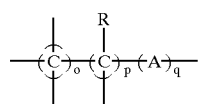

(CP2)

-continued

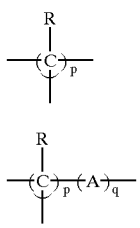

wherein R is halogen atom, hydrogen atom or a substituted or unsubstituted hydrocarbon group; A is a polyvalent organic group; and o, p and q denote respectively a positive integer.

Further, this invention provides a method of forming a pattern which comprises the steps of;

forming a mask material layer on a work film provided with an underlying pattern indicating a position information by coating a solution containing at least one kind of a network carbon polymer having a repeating unit represented by the following general formulas (CP1) to (CP4) on the work film;

forming a resist film on the mask material layer;

detecting the position information of the underlying pattern existing right below the resist film;

exposing the resist film to a patterning exposure light after correcting a position of an exposure pattern on the basis of a result of detection of the position information; and forming a resist pattern by developing the resist film which has been subjected to the patterning exposure:

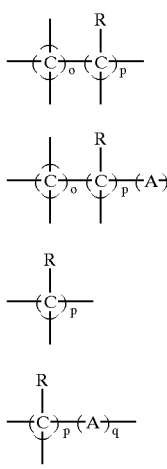

wherein R is halogen atom, hydrogen atom or a substituted or unsubstituted hydrocarbon group; A is a polyvalent organic group; and o, p and q denote respectively a positive integer.

Further, this invention also provides a method of forming a pattern which comprises the steps of;

forming a matrix pattern on a work film;

filling an opened space in the matrix pattern with a mask material layer containing at least one kind of a network carbon polymer having a repeating unit represented by the following general formulas (CP1) to (CP4) on the work film;

forming a mask material pattern by removing the matrix pattern; and forming a work film pattern by transferring the mask material pattern to the work film:

wherein R is halogen atom, hydrogen atom or a substituted or unsubstituted hydrocarbon group; A is a polyvalent organic group; and o, p and q denote respectively a positive integer.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Now, a first pattern-forming method according to this invention will be explained in details with reference to the drawings.

Figure 1A:
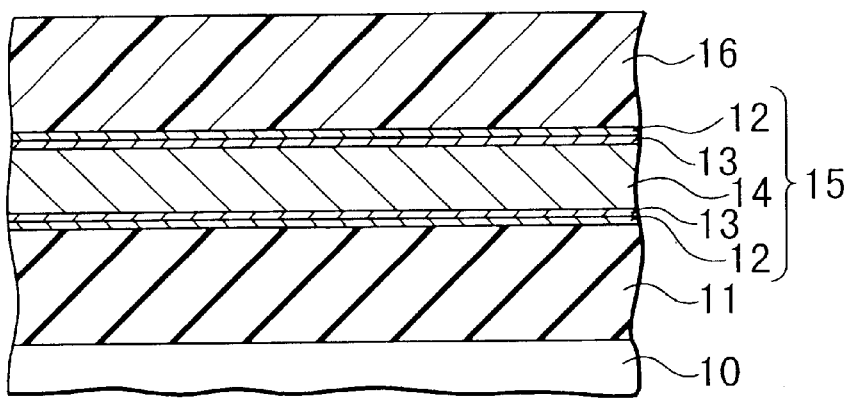
FIGS. 1A to 1C illustrate cross-sectional views illustrating one example of steps in the pattern-forming method according to this invention.

FIGS. 1A to 1C and FIGS. 2A to 2C illustrate cross-sectional views illustrating a first method of forming a pattern according to the present invention. First of all, as shown in FIG. 1A, a mask material layer 16 is formed on a work film formed in advance on the surface of a wafer substrate 10. As for the work film, it is possible to employ, though not limitative, a silicon-based insulating film such as silicon oxide film, a silicon nitride film, a silicon oxynitride film, a spin-on-glass, and a blank material in the manufacture of a mask; a silicon-based material such as amorphous silicon, polysilicon (polycrystalline Si) and silicon substrate; and a wiring material or electrode material such as aluminum, aluminum silicide, copper, tungsten, tungsten silicide, cobalt silicide and ruthenium. In the example shown in FIG. 1A, this work film is formed of a metal wiring layer 15 comprising a TiN layer 12, a Ti layer 13 and 0.5% Cu—Al layer 14. This metal wiring layer 15 is formed, via an insulating film 11, on the surface of a wafer substrate 10. By the way, the insulating film 11 may be formed of an $SiO_2$ film, a TEOS oxide film, etc. The film thickness of the insulating film 11 may be about 300 nm.

The mask material layer 16 to be formed on the metal wiring layer 15 contains a network carbon polymer having a repeating unit represented by the afore-mentioned general formulas (CP1) to (CP4).

Next, this network carbon polymer having a repeating unit represented by the general formulas (CP1) to (CP4) will be explained in detail.

In the repeating unit represented by the general formulas (CP1) to (CP4), R represents hydrogen atom, halogen atom, substituted or unsubstituted aliphatic hydrocarbon group and substituted or unsubstituted aromatic hydrocarbon group. Specific examples of the substituted or unsubstituted aliphatic hydrocarbon group and the substituted or unsubstituted aromatic hydrocarbon group to be employed as R are, though not limitative, methyl, ethyl, butyl, propyl, vinyl, ally, hexyl, cyclohexyl, 3-methoxypropyl, phenyl, naphthyl, benzyl, phenatyl, naphthoxyphenyl and biphenyl. "A" in the general formulas represents a polyvalent organic group, i.e. any kinds of bi- or more valent organic group.

As for specific examples of the repeating unit represented by the general formula (CP1), those represented by the following formulas [CP1-1] to [CP1-12] can be employed for instance.

[CP1-1]

[CP1-2]

[CP1-3]

[CP1-4]

[CP1-5]

[CP1-6]

[CP1-7]

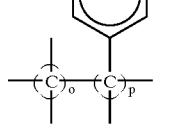

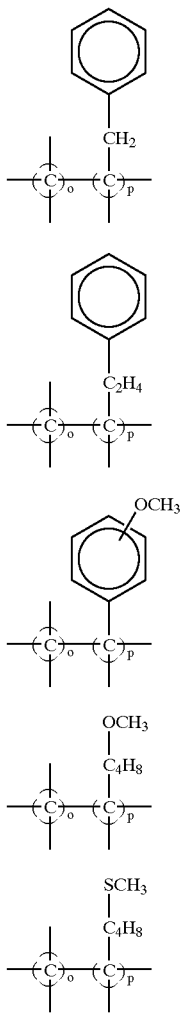

[CP1-8]

[CP1-9]

[CP1-10]

[CP1-11]

[CP1-12]

wherein o and p denote respectively a positive integer.

Although there is not any particular limitation regarding the ratio of o and p in a polymer having a repeating unit represented by the general formula (CP1), m should preferably be at least about 10% based on the entire polymer, while n should preferably be at least about 10% based on the entire polymer.

Further, the polymer having a repeating unit represented by the general formula (CP1) may be a copolymer containing, as a copolymer component, a repeating unit represented by the general formula (CP1) where R differs from that of other copolymer component. Specific examples are as follows.

[CP1-13]

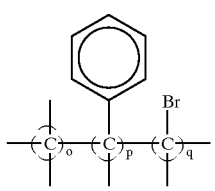

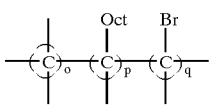

[CP1-14]

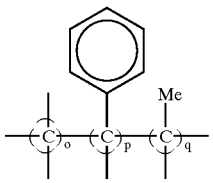

[CP1-15]

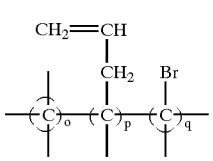

[CP1-16]

In the case of these copolymers, although there is not any particular limitation regarding o, p, and q, o should preferably be at least about 10% based on the entire polymer, while the total of p and q should preferably be at least about 10% based on the entire polymer.

As for specific examples of the repeating unit represented by the general formula (CP2), those represented by the following formulas can be employed for instance.

[CP2-1]

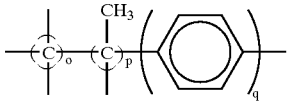

[CP2-2]

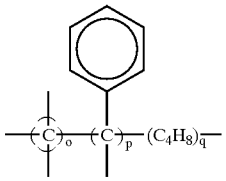

[CP2-3]

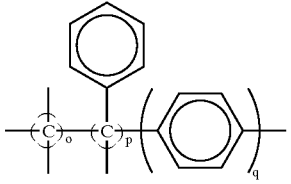

[CP2-4]

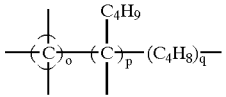

[CP2-5]

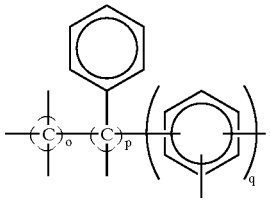

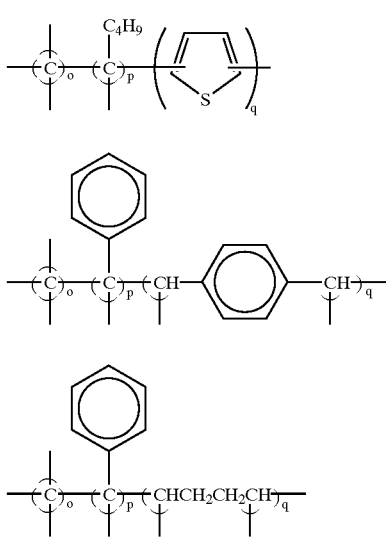

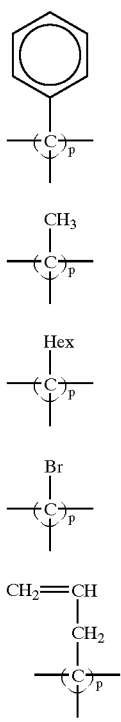

wherein o, p and q denote respectively a positive integer.

Although there is not any particular limitation regarding the ratio of o, p and q in a polymer having a repeating unit represented by the general formula (CP2), o should preferably be at least about 10% based on the entire polymer, p should preferably be at least about 10% based on the entire polymer, and q should preferably be at least about 10% based on the entire polymer.

Further, as for specific examples of the repeating unit represented by the general formula (CP3), the following formulas can be exemplified.

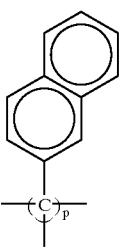

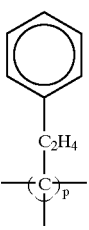

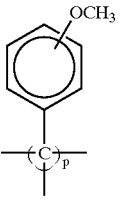

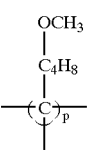

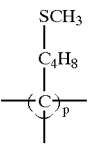

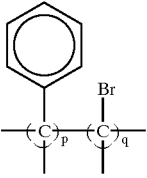

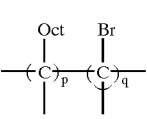

[CP3-14]

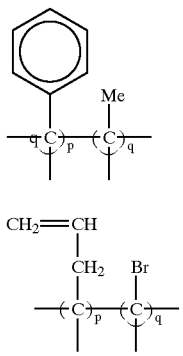

[CP3-15]

wherein p and q denote respectively a positive integer.

Further, as for specific examples of the repeating unit represented by the general formula (CP4), the following formulas can be exemplified.

[CP4-1]
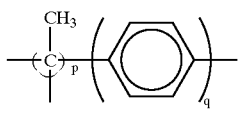

[CP4-2]
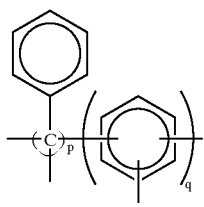

[CP4-3]
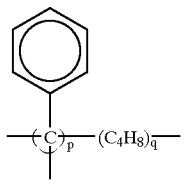

[CP4-4]
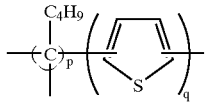

[CP4-5]
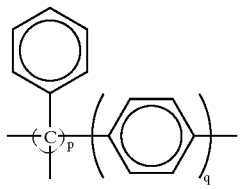

[CP4-6]
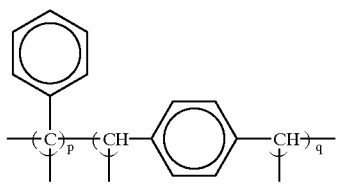

[CP4-7]
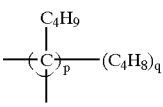

[CP4-8]
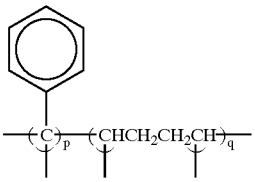

wherein p and q denote respectively a positive integer.

The network carbon polymer to be employed in this invention can be synthesized by the following method for instance.

The polymer having a repeating unit represented by the general formula (CP1) among the aforementioned network carbon polymers can be synthesized by a method wherein carbon tetrahalide and an organic monohalide are employed as raw materials of organic halide, which are then allowed to take place a condensation polymerization in a solvent with magnesium being employed as a polymerization initiator. If required, a catalyst may be added to this reaction mixture.

As for the carbon tetrahalide, compounds represented by the following general formula (HL-1) can be employed.

$$CX_4 \qquad (HL-1)$$

wherein Xs may be the same or different and are individually a halogen atom.

As for the halogen atom to be introduced as X into the aforementioned general formula (HL-1), F, Cl, Br and I may be employed. Specific examples of the carbon tetrahalide to be employed in this invention are as follow. $CCl_4$, $CBr_4$, $CI_4$, $CCl_2Br_2$, $CCl_2I_2$, $CBr_2I_2$, $CClBr_3$, $CFBr_3$, $CClI_3$, $ClBr_3$, $CF_2Br_2$, $CFI_3$, $CF_2I_2$, $CBrI_3$, and $ClCl_3$.

As for the organic monohalide, compounds represented by the following general formula (HL-2) can be employed.

$$R^1X \qquad (HL-2)$$

wherein $R^1$ represents substituted or unsubstituted aliphatic hydrocarbon group and substituted or unsubstituted aromatic hydrocarbon group; and X is halogen atom.

Specific examples of the aliphatic hydrocarbon group and the aromatic hydrocarbon group to be employed as $R^1$ in the general formula (HL-2) are, though not limitative, methyl, ethyl, propyl, vinyl, ally, ethynyl, methoxypropyl, butyl, hexyl, octyl, phenyl, phenatyl, biphenyl, naphthyl and anthranyl.

As for the halogen atom to be introduced as X into the aforementioned general formula (HL-2), F, Cl, Br and I may be employed.

Specific examples of organic monohalide to be employed in this invention are as follows. $CH_3I$  $CH_3CH_2Br$  $HC{\equiv}CCH_2Br$  $CH_2{=}CH_2Cl$  $HC{\equiv}CCH_2Br$  n-$C_4H_9Br$

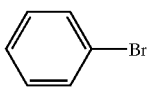

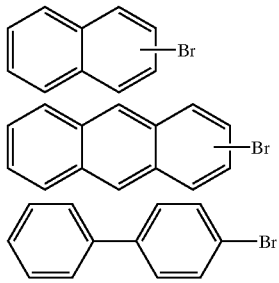

The polymer having a repeating unit represented by the general formula (CP2) among the aforementioned network carbon polymers can be synthesized by adding an organic polyvalent halide to the aforementioned reaction mixture.

As for the organic polyvalent halide to be employed in this case, compounds represented by the following general formula (HL-3) can be employed.

$$(R^2)_a X_b \qquad \text{(HL-3)}$$

wherein $R^2$ represents a polyvalent organic group selected from the group consisting of substituted or unsubstituted aliphatic hydrocarbon group and substituted or unsubstituted aromatic hydrocarbon group; X is halogen atom; a is a positive integer; and b is a positive integer of 2 or more.

Specific examples, though not limitative, of the organic polyvalent halide to be employed in this invention are as follow.

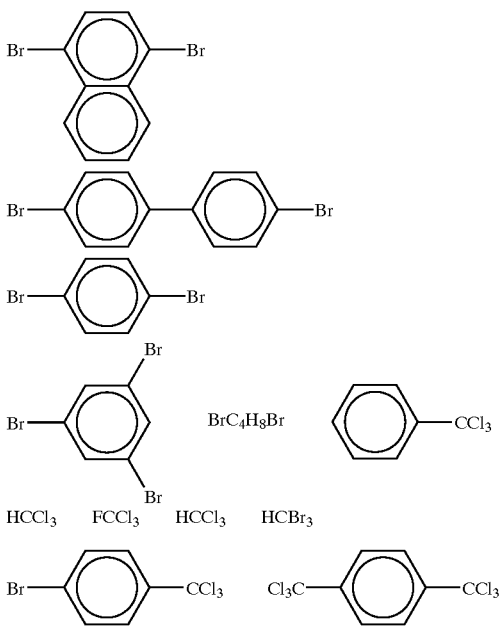

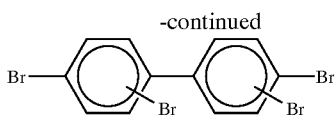

On the occasion of synthesizing the network carbon polymers to be employed in this invention by using of carbon tetrahalide, an organic monohalide and an organic polyvalent halide as raw materials, a predetermined amount of magnesium is added at first to an organic solvent to prepare a mixture, which is subsequently heated at a temperature of not higher than the reflux temperature of the solvent. The organic solvent to be employed in this case is one or more kinds of aprotic solvent. Specific examples of such a solvent are, though not limitative, an ether-based solvent such as diethyl ether, dibutyl ether, tetrahydrofuran, 1,4-dioxane, 1,2-dimethoxyethane and diglyme; an amine-based solvent such as triethylamine, pyridine and tetramethylethylene diamine; and a mixed solvent comprising an aromatic hydrocarbon-based solvent such as toluene and xylene and a tertiary amine-based solvent.

On the other hand, predetermined amounts of carbon tetrahalide, an organic monohalide and an organic polyvalent halide are dissolved in a solvent to prepare a solution. As for the solvent to be employed in this case, the same kinds of solvents or mixed solvents as described above may be employed.

Thereafter, a solution of any of the aforementioned halogen compounds is dropped into the aforementioned magnesium mixture at a reflux temperature, and then, the resultant reaction mixture is allowed to react for 1 to 100 hours at a temperature of not higher than the reflux temperature of the solvent.

It is possible in this reaction to add a catalyst. As for this reaction initiator, iodine or 1,2-bromoethane can be employed. As for the reaction promotor, a phase-transfer catalyst or a charge-transfer catalyst can be employed. It is also possible to add as a polymerization catalyst a metal complex represented for example by a nickel complex to the reaction mixture.

The reaction mixture obtained in this manner is then cooled down to room temperature, and then, mixed with a nonaqueous solvent such as toluene. After being sufficiently stirred, dilute hydrochloric acid is added thereto to obtain an acidic solution, thereby removing excessive magnesium and at the same time, allowing salts to be dissolved therein. Then, the resultant mixed solution is subjected to filtration to remove insoluble matter, which is then washed with a nonaqueous solvent such as toluene. This washed insoluble matter is then mixed with the filtrate.

After a phase of nonaqueous solvent such as toluene is separated from the filtrate, the nonaqueous solvent phase is washed with water until the liquid employed in the water washing becomes neutral. After the resultant solution of nonaqueous solvent such as toluene is dried using a desiccant such as magnesium sulfate, the resultant solution is concentrated under a reduced pressure. This concentrated solution is then mixed with at least ten times as large volume of ethanol, thereby allowing a polymer to precipitate.

Finally, the precipitate is filtrated and vacuum-dried to obtain a network carbon polymer having a repeating unit represented by the general formula (CP1) or (CP2).

It is also possible to obtain the network carbon polymer of this invention by a process wherein a solvent such as toluene is employed as an extracting solvent, and the insoluble matter is extracted by using a Soxhlet extractor. Alternatively, an ultrasonics can be employed for extracting the insoluble matter from an emulsion containing a solvent such as toluene, thereby obtaining the network carbon polymer of this invention.

By the way, it is possible, depending on the kind of an organic halide to be employed as a starting material, to select the kind of the repeating unit of polymer to be obtained. For example, when a carbon tetrahalide represented by the chemical formula (HL-1) and an organic monohalide represented by the chemical formula (HL-2) are employed as raw materials, a network carbon polymer having a repeating unit represented by the general formula (CP1) can be obtained. On the other hand, when a carbon tetrahalide represented by the chemical formula (HL-1), an organic monohalide represented by the chemical formula (HL-2) and an organic polyvalent halide represented by the chemical formula (HL-3) are employed as raw materials, a network carbon polymer having a repeating unit represented by the general formula (CP2) can be obtained.

Further, when only trihalomethane represented by the following general formula (HL-4) is employed as an organic polyvalent halide, a network carbon polymer having a repeating unit represented by the following general formula (CP3) can be obtained.

(HL-4)

(CP3)

wherein $R^3$ represents fluorine atom, hydrogen atom, or substituted or unsubstituted aliphatic hydrocarbon group or substituted or unsubstituted aromatic hydrocarbon group; R represents halogen atom, hydrogen atom, or substituted or unsubstituted aliphatic hydrocarbon group or substituted or unsubstituted aromatic hydrocarbon group; and p is a positive integer.

Additionally, when trihalomethane represented by the general formula (HL-4) and an organic polyvalent halide represented by the general formula (HL-3) are employed as raw materials, a network carbon polymer having a repeating unit represented by the following general formula (CP4) can be obtained.

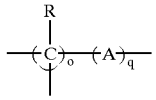
(CP4)

wherein R represents halogen atom, hydrogen atom, or substituted or unsubstituted aliphatic hydrocarbon group or substituted or unsubstituted aromatic hydrocarbon group; A is a polyvalent organic group; and p and q are respectively a positive integer.

The aforementioned various halides (carbon tetrahalides, organic monohalides and organic polyvalent halides) may be incorporated concurrently or sequentially. By suitably selecting the composition ratios of carbon tetrahalides, organic monohalides and organic polyvalent halides, it is possible to control the content of R to be introduced into a polymer being obtained. In this case, by suitably selecting the kinds of each halide, it is possible to synthesize a copolymer containing a combination of repeating units represented by the general formulas (CP1) to (CP4).

The polymer synthesized by the procedure as described above includes a residual unreacted carbon-halogen (C—X) bond, and also, hydroxyl group and carbonyl group that have been generated as part of the (C—X) bond is reacted with water in the post-treatment of the polymer. Furthermore, since the reactive terminal (C—MgX) of the polymer is also caused to react with an acid or water on the occasion of post-treatment to generate C—H bond, the resultant polymer also includes this C—H bond.

The quantity of these C—OH bond, C—X bond, C=O bond and C—H bond existing in the polymer depends on the kinds of raw materials and solvent as well as on the reaction time.

The network carbon polymer having a repeating unit represented by any of the aforementioned general formulas (CP1) to (CP4) may contain an additional unit as exemplified below.

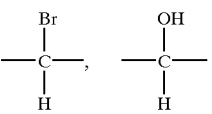

Since the network carbon polymer to be employed in this invention is excellent in solubility to an organic solvent such as an ether-based solvent, a ketone-based solvent, an ester-based solvent, a halogen-based solvent and an aromatic hydrocarbon-based solvent, it can be easily formed into a film by using a coating method such as a spin-coating. Moreover, since this network carbon polymer is high in degree of crosslinking, the film formed of this network carbon polymer is also excellent in mechanical strength. Additionally, since the network carbon polymer to be employed in this invention is highly absorptive to an ultraviolet ray of 300 nm or less in wavelength, a mask material of this invention can be suited for use as an anti-reflective film.

The film thickness of the mast material 16 should preferably be in the range of 10 to 5,000 nm, more preferably in the range of 100 to 1,000 nm. Because if the film thickness of the mast material 16 is less than 10 nm, the mask material may be totally etched out on the occasion of etching the work film 15 by using this mask material pattern as an etching mask. On the other hand, if the film thickness of the mast material 16 is more than 5,000 nm, there is a possibility that an etch bias may become prominent on the occasion of transferring the pattern of resist to the mask material film by means of a dry etching method.

The complex index of refraction of the mask material 16 at an exposure wavelength should desirably be in the range of $1.0 \leq n \leq 2.5$; and $0.05 \leq k \leq 1.0$ in order to obtain a resist pattern of excellent dimension controllability by suppressing the exposure light from returning back to the resist from the work film 15. Here, n is the refractive index and k is the extinction coefficient. Further the k value in the wavelength zone of an alignment light should preferably be 0.6 or less, more preferably 0.2 or less. If the k value in the wavelength zone of an alignment light is larger than 0.6, the optical density of the alignment light in the mask material may become excessive, thereby deteriorating the permeability of the alignment light to the mask material, so that when an underlying pattern exists below the mask material, it becomes difficult to detect this underlying pattern.

Since a π-orbit is not involve in the carbon-carbon bond in the main chain of the network carbon polymer in the case of the repeating unit represented by the general formulas (CP-1) to (CP-4), the light in the visible light zone that is usually employed as an alignment light can be hardly absorbed by the unit. Therefore, it is possible to improve the transparency of the mask material to an alignment light by increasing the ratio of these network carbon polymer in the mask material. Further, by increasing the ratio of these network carbon polymers having a repeating unit represented by the general formulas (CP-1) to (CP-4) in the mask material, the content of carbon atom in the mask material can be increased, thereby making it possible to enhance the etching resistance. Namely, by increasing the ratio of these network carbon polymers having a repeating unit represented by the general formulas (CP-1) to (CP-4) in the mask material, the mask material can be improved in two respects, i.e. the transparency to an alignment light and the etching resistance.

The mask material layer 16 can be formed on the surface of a work film either by the method of coating a solution, or by a vapor phase deposition such as CVD method (chemical vapor phase deposition method). However, the coating method is more preferable for forming a mask material layer. The reason for this is that as compared with the CVD method, the coating method is more simple in process and low in cost. Next, the method of forming a mask material by means of a coating method will be explained.

First of all, a network carbon polymer having a repeating unit represented by any of the general formulas (CP-1) to (CP-4) is dissolved in an organic solvent to prepare a solution. As for the weight average molecular weight of the network carbon polymer to be employed, it should preferably be in the range of 200 to 200,000, though there is not any particular limitation. Because, if the weight average molecular weight of the network carbon polymer is less than 200, the mask material would be dissolved by a solvent to be employed for the resist. On the other hand, if the weight average molecular weight of the network carbon polymer is more than 200,000, it becomes difficult to dissolve the mask material in an organic solvent, thus making it possible to difficult to prepare a solution.

Examples of the organic solvent useful in this case are, though not limitative, a ketone type solvent such as acetone, methylethyl ketone, methylisobutyl ketone and cyclohexanone; a Cellosolve type solvent such as methyl Cellosolve, methyl Cellosolve acetate and ethyl Cellosolve acetate; an ester type solvent such as ethyl lactate, ethyl acetate, butyl acetate and isoamyl acetate; alcohol type solvent such as methanol, ethanol and isopropanol; anisol; toluene; xylene; naphtha; etc.

Further, if desired, the solution of mask material may contain for example, an adhesion improver for improving the adhesivity of the mask material to a work film, a dye capable of absorbing ultraviolet rays thereby to prevent light from reflecting into a resist film from the work film, a polymer capable of absorbing ultraviolet rays such as polysulfone, polybenzimidazole, an electric conductive material, a substance which becomes conductive as it is exposed to light or heat, and a binder polymer which is adapted to fill an interface between network carbon polymers so as to obtain a high quality film.

The mask material layer 16 may be formed using a composition wherein a crosslinking agent is incorporated into the aforementioned network carbon polymer. As for the crosslinking agent useful in this case is a compound having two or more carbon-carbon multiple bonds in its molecule. Specific examples of such a compound having the multiple bond are, though not limitative, those having vinyl, allyl, ethynyl, 1,3-butanediethyl or propargyl group. The compound having such a multiple bond may be of any state, i.e. a monomer, an oligomer or a polymer.

This compound having a multiple bond causes the crosslinking of a network carbon polymer to take place through a reaction between this compound and an active species that has been generated from the decomposition of a portion of the network carbon polymer by the effect of heat or light. Further, this compound having a multiple bond may be such that has been self-polymerized. Followings are specific examples of the compound having two or more carbon-carbon multiple bonds in its molecule.

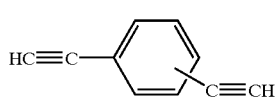

[LK-1]

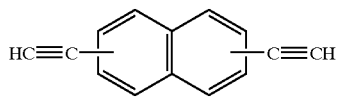

[LK-2]

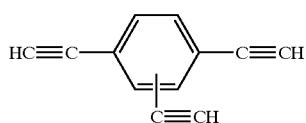

[LK-3]

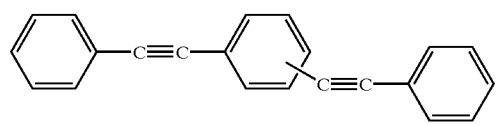

[LK-4]

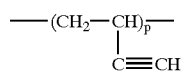

[LK-5]

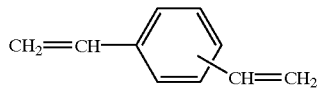

[LK-6]

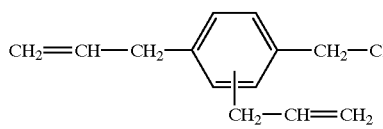

[LK-7]

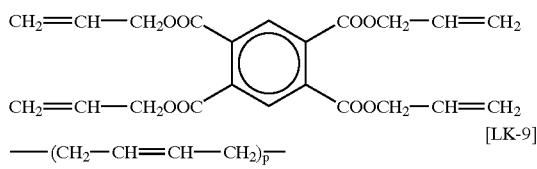

[LK-8]

—(CH$_2$—CH=CH—CH$_2$)$_{\overline{p}}$—

[LK-9]

The mixing ratio of the crosslinking agent should preferably be in the range of 0.001 to 300 parts by weight, more preferably 0.1 to 50 parts by weight per 100 parts by weight of the network carbon polymer.

It is also possible employ a crosslink promotor in addition to the aforementioned crosslinking agent. One example of the crosslinking promotor is a radical-generating agent which can be any kinds of compound as long as the compound is capable of generating a radical by the effects of heat or light. Specific examples of radical-generating agent are, though not limitative, an azo compound (such as azobisisobutyronitrile), an organic peroxide, thiuram, silylperoxide, alkylaryl ketone, an organic halide, etc. The mixing ratio of the crosslink promotor should preferably be in the range of 0.001 to 50 parts by weight, more preferably in the range of 0.1 to 20 parts by weight per 100 parts by weight of the network carbon polymer.

As explained above, a coating material to be employed as a raw material of mask material can be prepared by dissolving a predetermined network carbon polymer, or depending on circumstances, by dissolving a network carbon polymer and additional compounds in an organic solvent. The coating material thus prepared is then coated on a work film by means of a spin-coating method for instance to thereby form a film of coating. Since the network carbon polymer to be employed in this invention contains an organic group in its repeating unit, it can be easily dissolved in an organic solvent, thus making it possible to normally coat the coating material to form a film. The film of coating is then heated by means of a hot plate or an oven so as to evaporate the solvent, thus forming the mask material 16 which is excellent in heat resistance and solvent resistance. These excellent properties of the mask material 16 can be ascribed to the fact that the film containing a network carbon polymer to be employed in this invention is brought into an insolubilized state due to an increased crosslinking between polymer molecules, which is caused by the pyrolysis of carbon-halogen (C—X) bond in the polymer in the heat treatment thereof.

The temperature in this heat treatment should preferably be in the range of 50 to 700° C., more preferably in the range of 70 to 500° C. If this temperature is lower than 50° C., it becomes impossible to sufficiently evaporate the solvent. On the other hand, if this temperature is higher than 700° C., it may lead to a denaturation of the work film.

Although there is not any particular limitation with respect to the heating atmosphere, it is preferably, if the resistance property of mask might be deteriorated due to the oxidation of the network carbon polymer, to perform the heating in a low oxygen atmosphere where the concentration of oxygen is 10% or less, more preferably 1% or less.

It is also possible to irradiate a heating or energy beam onto the film of coating. Since an organic group contained in the mask material 16 can be evaporated or carbonized by this irradiation of energy beam, a film excellent in etching resistance can be obtained. As for the energy beam, it may be ultraviolet rays, X-rays, electron beam, ion beam, etc.

If the irradiation of ultraviolet rays is to be utilized in this case, it should preferably include a wavelength of not more than 450 nm or the irradiation dose should preferably be 0.1 mJ/cm$^2$ or more. Because, if the irradiation of ultraviolet rays is performed with a wavelength of more than 450 nm or with an irradiation dose of less than 0.1 mJ/cm$^2$, it becomes impossible to sufficiently achieve the evaporation or carbonization of the organic group in the mask material 16. If the irradiation of electron beam is to be utilized in this case, it is preferable to control the electron beam such that the accelerating voltage is within the range of 0.1 to 1,000 keV and the irradiation dose is within the range of 0.1 $\mu$C/cm$^2$ to 10,000 C/cm$^2$. Because, if the accelerating voltage is less than 0.1 keV, only the surface zone would be irradiated with the electron beam, whereas if the accelerating voltage exceeds over 1,000 keV, the electron beam would pass through the mask material, thereby extremely deteriorating the irradiation efficiency. On the other hand, if the irradiation dose is less than 0.1 $\mu$C/cm$^2$, it becomes impossible to sufficiently achieve the evaporation or carbonization of the organic group in the mask material 16. On the other hand, if the irradiation dose exceeds over 10,000 C/cm$^2$, it would lead to an increase in treatment time.

If there is a possibility that the etching resistance might be deteriorated due to the oxidation of the network carbon polymer as a result of heating or of the irradiation of energy beam, it is preferable to perform the heating or the irradiation of energy beam in a low oxygen atmosphere where the concentration of oxygen is 10% or less, more preferably 1% or less. Further, the irradiation of energy beam and the heating may be performed concurrently.

Figure 1B:
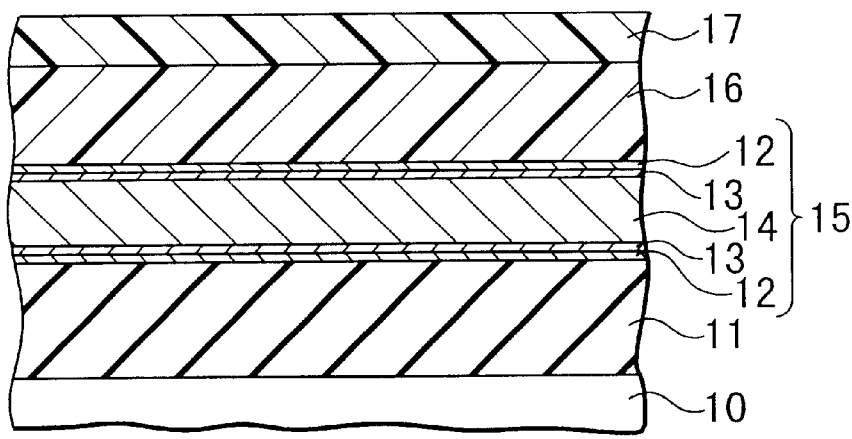

Next, a resist solution is coated on the mask material layer 16 by means of a spin-coating method for instance to thereby form a resist layer, which is then heated by means of a hot plate or an oven so as to evaporate the solvent, thus forming a resist film 17 as shown in FIG. 1B. When the film thickness of the resist film 17 is reduced, it is possible to improve, in proportion to the reduction in thickness of the resist film 17, the light exposure tolerance, focus tolerance and resolution at the time of patterning exposure. Therefore, the film thickness of the resist film 17 should be made as thin as possible as far as it enables the mask material layer 16 to be etched with an excellent dimension controllability. Preferably, the film thickness of the resist film 17 should be in the range of 10 to 10,000 nm. If the film thickness of the resist film 17 is less than 10 nm, it would be difficult to form the mask material pattern having an excellent cross-section. On the other hand, if the thickness of the resist film 17 is more than 10,000 nm, deterioration in resolution would be caused.

As for the composition of resist for forming the resist film 17, there is not any particular limitation as long as it can be patterned by way of exposure using a visible radiation or an ultraviolet radiation. Positive resist or negative resist may be used. Specific examples of the positive resist are a resist composition comprising naphthoquinone diazide and novolak resin (IX-770, JSR Co.); a chemical amplification type resist composition comprising polyvinylphenol resin protected by t-BOC and an acid-generating agent (APEX-E, Shiplay Co.); and a resist composition comprising a polyvinylphenol resin formed of a copolymerized product of tertiary butylmethacrylate and an acid-generating agent (UVIIHS, Shiplay Co.). Further, specific examples of the negative resist are, though not limitative, a chemical amplification type resist comprising polyvinylphenol, melamine resin and a photo-acid generating agent (SNR200, Shiplay Co.), and a resist comprising polyvinylphenol and a bisazide compound (RD-2000N, Hitachi Kasei Co., Ltd.).

By the way, if the mask material layer 16 employed in this case is such that can be hardly etched in relative to a resist pattern made of an ordinary organic resist on the occasion of transferring a resist pattern to the mask material layer 16, it is preferable to employ a resist comprising silicone. The mixing ratio of the silicone in this case should desirably be in the range of 1 to 50 parts by weight per 100 parts by weight of solid content in the resist. Because if the content of the silicone is less than 1 part by weight, it becomes impossible to obtain a sufficient etching resistance, and if the content of the silicone exceeds over 50 parts by weight, the stability of the resist would be deteriorated.

Then, the wafer substrate 10 bearing the resist film 17 formed thereon is subjected to a patterning exposure. As for the light source of the exposure light, ultraviolet rays, X-rays, electron beam or ion beam can be employed. Specific examples of the ultraviolet rays are the g-line (wavelength=436 nm) or i-line (wavelength=365 nm) of mercury lamp, XeF (wavelength=351 nm); or excimer laser such as XeCl (wavelength=308 nm), KrF (wavelength=248 nm), KrCl (wavelength=222 nm), ArF (wavelength=193 nm) and F$_2$ (wavelength=151 nm). If desired, it is also possible to perform a post exposure bake by using a hot plate or oven.

Figure 1C:
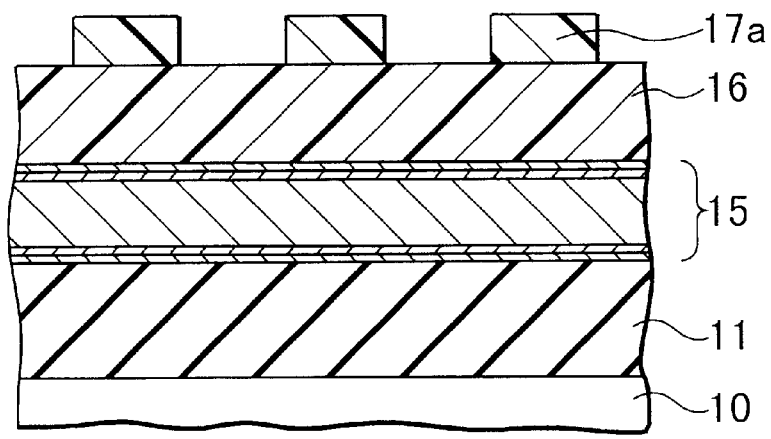

Thereafter, a developing treatment is performed using an alkaline developing solution comprising TMAH (tetramethyl ammonium hydroxide) or choline, thereby forming a resist pattern 17a as shown in FIG. 1C.

Figure 2A:
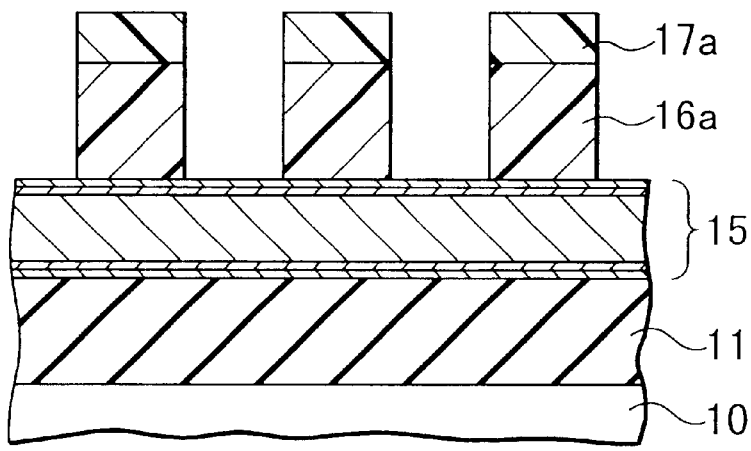
FIGS. 2A to 2C illustrate cross-sectional views illustrating another example of steps in the pattern-forming method according to this invention.

The resist pattern 17a thus obtained is then used as an etching mask to dry-etch the mask material layer 16, thereby transferring the resist pattern 17a to the mask material layer 16 to form a mask material pattern 16a as shown in FIG. 2A. As for the etching method to be employed in this case, a reactive ion etching, a magnetron type reactive ion etching, an electron beam ion etching, an ICP etching or ECR ion etching may be employed. Namely, there is not any particular limitation on this etching method as long as it is possible to perform a fine etching process.

Although there is not any particular limitation regarding the source gas, a gas containing oxygen atom such as $O_2$, CO, and $CO_2$; an inert gas such as He, $N_2$, and Ar; a chlorine-type gas such as $Cl_2$ and $BCl_3$ or $H_2$ may be used.

Figure 2B:
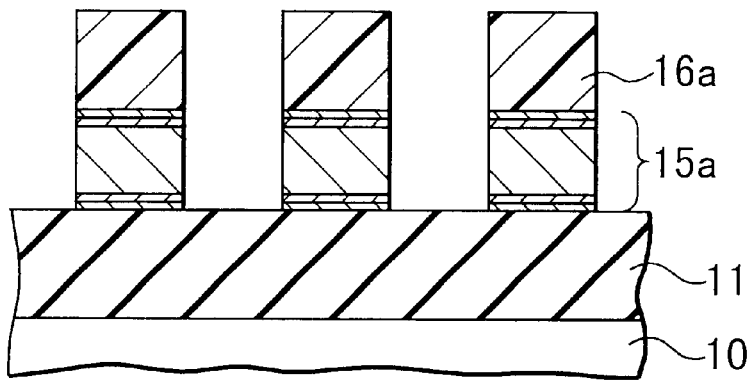

Thereafter, by using the resist pattern 17a and the mask material pattern 16a as an etching mask, the metal wiring layer 15 constituting the work film is etched to form a metal wiring pattern 15a as shown in FIG. 2B. As for the etching method to be employed in this case, a reactive ion etching, a magnetron type reactive ion etching, an electron beam ion etching, an ICP etching or ECR ion etching may be employed. Namely, there is not any particular limitation on this etching method as long as it is possible to perform a fine etching process.

Since the mask material layer 16 formed of a network carbon polymer of this invention is featured in that the basic skeleton thereof is constituted by carbon atom which can be hardly sputtered, it is possible to secure a sufficient etching resistance irrespective of the kinds of etchant to be employed. As a result, the generation of cutout or recession of the shoulder portion of mask material pattern 16a can be prevented, thus making it possible to work the work film 15 while assuring an excellent anisotropic etching thereof. In this working step, the resist pattern 17a may be removed so as to perform the etching of the work film 15 using only the mask material pattern 16a as an etching mask. Especially, if the working of the work film 15 is to be performed extremely finely with a high aspect ratio, it is preferable to remove the resist pattern 17a formed on the mask material pattern 16a in a separate apparatus or in the same apparatus in subsequent to the step of forming the mask material pattern 16a so as to minimize the aspect ratio of the etching mask at the working step of the work film 15. In this case, since the etching mask on the occasion of working the work film 15 is constituted by only the mask material pattern 16a to which the resist pattern has been transferred, it is possible to minimize the aspect ratio and to suppress the microloading effect.

Figure 2C:
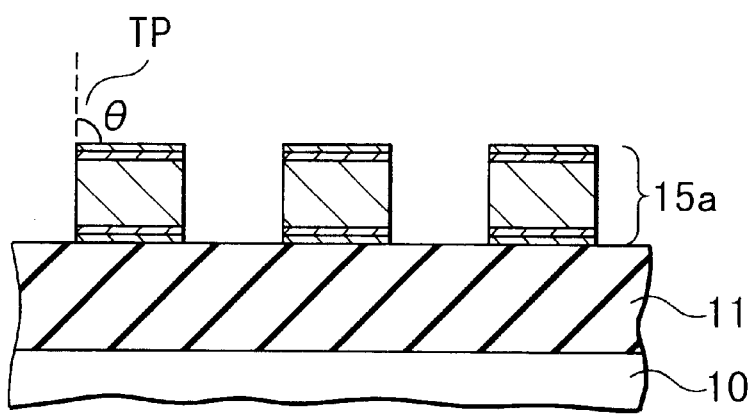

Then, the resist pattern 17a and the mask material pattern 16a that have been left after the step of etching are removed thereby to obtain a structure shown in FIG. 2C. As for this removing method, there is not any particular limitation. However, since no inorganic atom is included in the mask material layer formed using a network carbon polymer of this invention, it is possible to employ a method which is usually employed for removing the resist pattern, i.e. an ashing method where oxygen radicals are irradiated onto the mask material layer by means of an asher to thereby ash the mask material layer, or the mask material layer is immersed in a mixed solution consisting of sulfuric acid and hydrogen peroxide to thereby ash the mask material layer, thus making it possible to easily remove not only the resist pattern 17a but also the mask material pattern 16a.

It is also possible, according to this invention, to interpose an interlayer containing an inorganic atom between the mask material layer 16 and the resist film 17. Examples of inorganic atom in this case are, though not limitative, Si, W, Ti, Al and Cu. The content of these inorganic atoms should preferably be in the range of 5 to 80 parts by weight per 100 parts by weight of the solid contents of the interlayer. Because, if the content of these inorganic atoms is less than 5 parts by weight, a sufficient etching resistance of the interlayer may not be secured on the occasion of transferring the pattern of interlayer to the mask material layer 16. On the other hand, if the content of these inorganic atoms is more than 80 parts by weight, it becomes difficult to form the interlayer by using a coating method, thereby leading to an increase in manufacturing cost.

The film thickness of the interlayer should preferably be in the range of 10 to 1,000 nm. Because, if the film thickness of the interlayer is less than 10 nm, the interlayer pattern may be erased out or the shoulder portion thereof may be cut out on the occasion of transferring the pattern of interlayer that has been obtained through transcription from the resist pattern to the mask material layer 16, thereby making it difficult to etch the interlayer while securing an excellent dimension controllability. On the other hand, if the film thickness of the interlayer exceeds over 1,000 nm, it becomes difficult to transfer the resist pattern to the work film while limiting etch bias.

After this interlayer has been formed, a resist film is formed on this interlayer in the same manner as that where this interlayer is not employed, and then, the resist film is subjected to a patterning exposure to form a resist pattern.

The resist pattern thus obtained is then used as an etching mask to etch the interlayer, thereby transferring the resist pattern to the interlayer to form an interlayer pattern. As for the etching method to be employed in this case, a reactive ion etching, a magnetron type reactive ion etching, an electron beam ion etching, an ICP etching or ECR ion etching may be employed. Namely, there is not any particular limitation on this etching method as long as it is possible to perform a fine etching process.

Then, the interlayer pattern thus obtained is used as an etching mask to etch the mask material layer, thereby transferring the interlayer pattern to the mask material layer to form a mask material pattern. As for the etching method to be employed in this case, a reactive ion etching, a magnetron type reactive ion etching, an electron beam ion etching, an ICP etching or ECR ion etching may be employed. Namely, there is not any particular limitation on this etching method as long as it is possible to perform a fine etching process. Although there is not any particular limitation regarding the source gas, a gas containing oxygen atom such as $O_2$, CO, and $CO_2$; an inert gas such as He, $N_2$, and Ar; a chlorine-type gas such as $Cl_2$ and $BCl_3$ or $H_2$ may be used.

Thereafter, the mask material pattern thus obtained is used as an etching mask to dry-etch the work film in the same manner where the interlayer is not employed, thereby transferring the mask material pattern to the work film. Since the mask material layer formed of a network carbon polymer of this invention is featured in that the basic skeleton thereof is constituted by carbon atom, the mask material layer can be hardly sputtered, thus making it possible to secure a sufficient etching resistance irrespective of the kinds of etchant to be employed. As a result, the generation of cutout or recession of the shoulder portion of mask material pattern can be prevented, thus making it possible to work the work film while assuring an excellent anisotropic etching thereof. It is possible in this working step to remove the resist pattern and to perform the etching of the work film using only the interlayer pattern and the mask material pattern as an etching mask.

Finally, in the same manner where the interlayer is not employed, the resist pattern and the mask material pattern left after the etching are removed.

As explained above, according to this first method of forming a pattern, a mask material containing a specific network carbon polymer is formed below the resist film. Further, since the mask material layer to be formed according to this invention is excellent in etching resistance, it is possible to work a work film while assuring an excellent anisotropic etching of the work film even if the film thickness of a resist film is reduced. Moreover, the mask material can be normally coated in a wet method and the resultant mask material layer thus formed can be removed by means of an ashing treatment after finishing the working of the work film.

Next, a second pattern-forming method according to this invention will be explained in details with reference to the drawings.

FIGS. 3A to 3C and FIGS. 4A to 4D illustrate cross-sectional views illustrating the steps in the second pattern-forming method according to this invention.

Figure 3A:
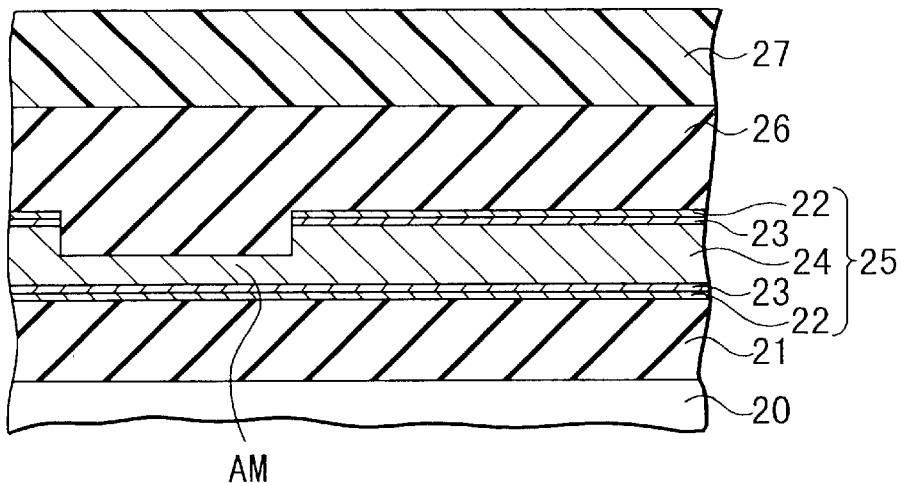
FIGS. 3A to 3C illustrate cross-sectional views illustrating another example of steps in the pattern-forming method according to this invention.

First of all, as shown in FIG. 3A, a mask material layer 27 is formed on a work film 26 formed in advance on the surface of a wafer substrate 20. As for the work film, it is possible to employ, though not limitative, the same kinds of materials as employed in the aforementioned first pattern-forming method.

In the example shown in FIG. 3A, the work film 26 is formed, via an insulating film 21 and a metal wiring layer 25, on the surface of a wafer substrate 20. The insulating film 21 may be formed of an $SiO_2$ film, a TEOS oxide film, etc. The film thickness of the insulating film 21 may be about 300 nm. The metal wiring layer 25 is formed of a laminate structure comprising a TiN layer 22, a Ti layer 23 and 0.5% Cu—Al layer 24.

In this second pattern-forming method, since the correction of position is to be performed, an underlying pattern is formed below the work film. Specifically, as shown in FIG. 3A, the underlying pattern indicated by the symbol of AM is formed on the metal wiring layer 25 formed below the work film. This underlying pattern may be formed on the work film. Further, there is any particular limitation with respect to the size and configuration of the underlying pattern, i.e. the size and configuration of the underlying pattern can be optionally determined.

The mask material layer 27 can be formed on the surface of the work film 26 by using the same material as employed in the aforementioned first pattern-forming method.

Figure 3B:
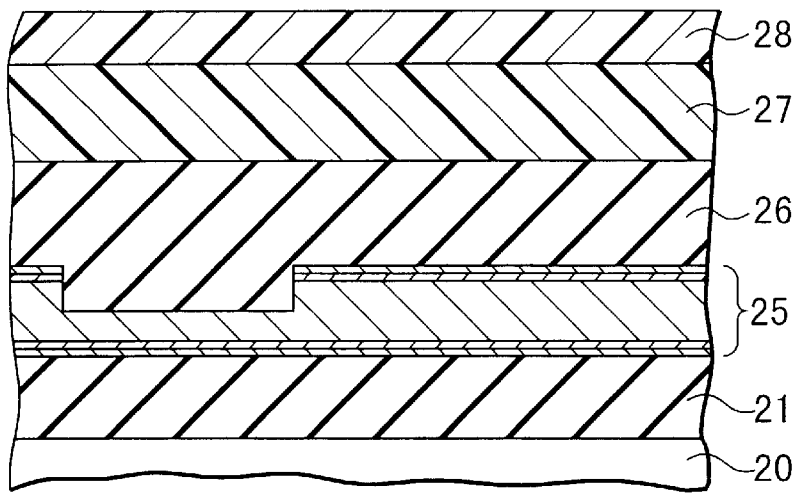

Then, a resist solution is coated on the mask material 27 by means of a spin-coating method for instance to thereby form a film of coating, which is then heated by means of a hot plate or an oven so as to evaporate the solvent, thus forming a resist film 28 as shown in FIG. 3B. With respect to the resist composition for forming the resist film 28, the method of forming the resist film 28 and the film thickness of the resist film 28, they may be the same as those explained in the aforementioned first pattern-forming method.

Because of the same reason as explained with reference to the aforementioned first pattern-forming method, it is possible to employ a resist containing silicone in the range of 1 to 50 parts by weight per 100 parts by weight of the solid contents.

Figure 3C:
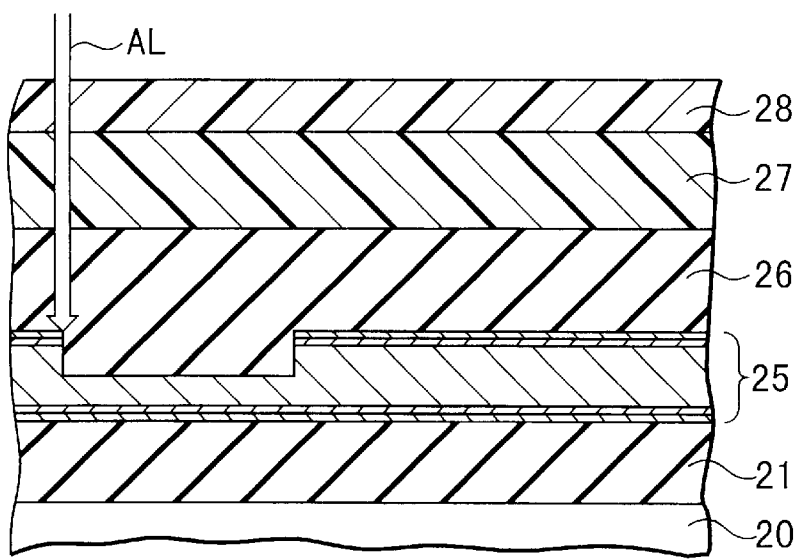

Thereafter, as shown in FIG. 3C, an alignment light AL including a visible radiation is irradiated onto the wafer substrate 20 bearing the resist film 28 formed thereon so as to detect the information of the position of the underlying pattern AM. Preferably, this alignment light AL should be irradiated so as not to photosensitize the resist film 28. Preferably, the wavelength of this alignment light AL should comprise a wavelength selected from the range of 300 to 800 nm. Because, if the wavelength is less than 300 nm, the resist would be photosensitized, while if the wavelength exceeds over 800 nm, it becomes difficult to perform the detection of position if the underlying pattern is a fine pattern. Since a π-orbit is not involve in the carbon-carbon bond in the main chain of the network carbon polymer to be employed in this invention, the absorption of light in the visible light zone is minimal. Therefore, it is possible to perform the detection of position with high precision by using the return light of the alignment light from the underlying pattern AM.

Figure 4A:
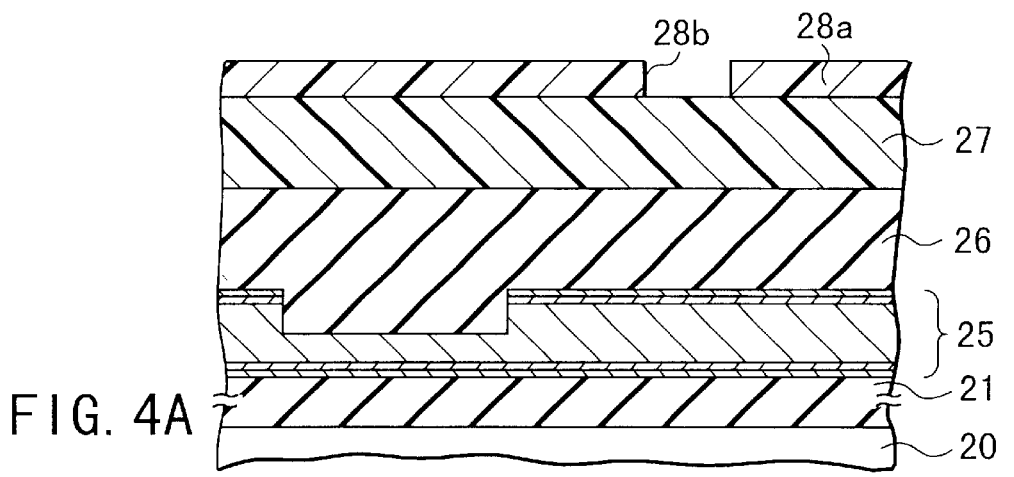
FIGS. 4A to 4D illustrate cross-sectional views illustrating another example of steps in the pattern-forming method according to this invention.

Then, as shown in FIG. 4A, a resist pattern 28a is formed. The formation of this resist pattern can be performed by a process wherein the correction in position of pattern to be exposed is made at first and then, the resist film 28 is subjected to a patterning exposure. As for the light source of the exposure light, the same kinds of light source as employed in the aforementioned first pattern-forming method, i.e. ultraviolet rays, X-rays, electron beam or ion beam can be employed. If desired, it is also possible to perform a post exposure bake by using a hot plate or oven. Thereafter, a developing treatment is performed using an alkaline developing solution comprising TMAH (tetramethyl ammonium hydroxide) or choline, thereby forming a resist pattern 28a. Since the detection of position of the underlying pattern AM can be achieved with high precision, the resist pattern 28a can be formed with high alignment precision in relative to the underlying pattern.

Figure 4B:
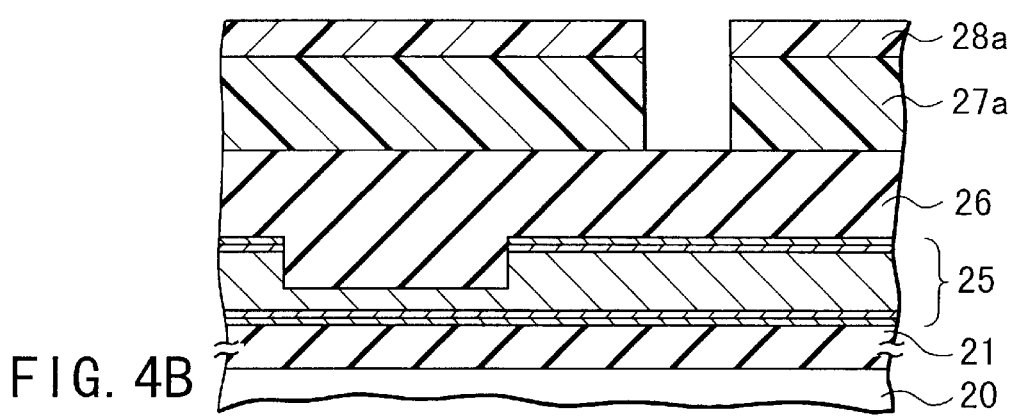

Then, the resist pattern 28a thus formed is then used as an etching mask to dry-etch the mask material layer 27, thereby transferring the resist pattern 28a to the mask material layer 27 to form a mask material pattern 27a as shown in FIG. 4B. As for the etching method and source gas to be employed in this case, they may be the same as those employed in the aforementioned first pattern-forming method.

Figure 4C:
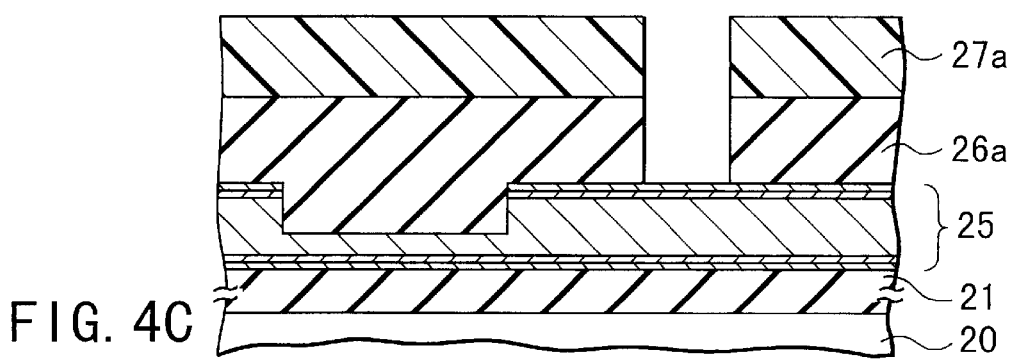

Thereafter, by using the resist pattern 28a and the mask material pattern 27a as an etching mask, the work film 26 is dry-etched to transfer the mask material pattern 27a to the work film 26 as shown in FIG. 4C, thereby forming a work film pattern 26a. As for the etching method to be employed in this case, a reactive ion etching, a magnetron type reactive ion etching, an electron beam ion etching, an ICP etching or ECR ion etching may be employed. Namely, there is not any particular limitation on this etching method as long as it is possible to perform a fine etching process.

Since the mask material layer 27 formed of a network carbon polymer of this invention is featured in that the basic skeleton thereof is constituted by carbon atom which can be hardly sputtered, it is possible to secure a sufficient etching resistance irrespective of the kinds of etchant to be employed. As a result, the generation of cutout or recession of the shoulder portion of mask material pattern 27a can be prevented, thus making it possible to work the work film 26 while assuring an excellent anisotropic etching thereof. In this working step, the resist pattern 28a may be removed so as to perform the etching of the work film 26 using only the mask material pattern 27a as an etching mask. Especially, if the working of the work film 26 is to be performed extremely finely with a high aspect ratio, it is preferable to remove the resist pattern 28a formed on the mask material pattern 27a in a separate apparatus or in the same apparatus in subsequent to the step of forming the mask material pattern 27a so as to minimize the aspect ratio of the etching mask at the working step of the work film 26. In this case, since the etching mask on the occasion of working the work film 26 is constituted by only the mask material pattern 27a to which the resist pattern has been transferred, it is possible to minimize the aspect ratio and to suppress the microloading effect.

Figure 4D:
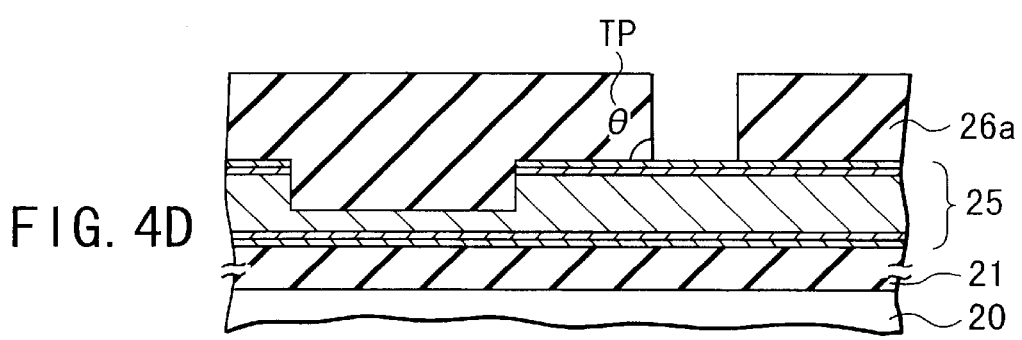

Then, the resist pattern 28a and the mask material pattern 27a that have been left after the step of etching are removed thereby to obtain a structure shown in FIG. 4D. As for this removing method, there is not any particular limitation. However, since no inorganic atom is included in the mask material layer formed using a network carbon polymer of this invention, it is possible to employ a method which is usually employed for removing the resist pattern, i.e. an ashing method where oxygen radicals are irradiated onto the mask material layer by means of an asher to thereby ash the mask material layer, or the mask material layer is immersed in a mixed solution consisting of sulfuric acid and hydrogen peroxide to thereby ash the mask material layer, thus making it possible to easily remove not only the resist pattern 28a but also the mask material pattern 27a.

It is also possible, in this second pattern-forming method, to interpose an interlayer containing an inorganic atom between the mask material layer 27 and the resist film 28. As for the material and the film thickness of the interlayer, they may be the same as those of the aforementioned first pattern-forming method.

After this interlayer has been formed, a resist film is formed on this interlayer in the same manner as that where this interlayer is not employed, and after the information on the position of the underlying pattern is detected, the correction in position of pattern to be exposed is performed on the basis of the detected information of position, after which the resist film is subjected to a patterning exposure to thereby form a resist pattern. It is possible, even in the case where the interlayer is formed in this manner, to perform the same degree of high precision alignment as that where this interlayer is not formed.

The resist pattern thus obtained is then used as an etching mask to etch the interlayer, thereby transferring the resist pattern to the interlayer to form an interlayer pattern, which is then employed as an etching mask to etch the mask material layer to obtain a mask material pattern. As for the etching method and source gas to be employed in this case, they may be the same as those explained hereinabove.

Thereafter, the mask pattern thus obtained is used as an etching mask to dry-etch the work film in the same manner as explained above, thereby transferring the mask material pattern to the work film. Since the mask material layer formed of a network carbon polymer of this invention is featured in that the basic skeleton thereof is constituted by carbon atom, the mask material layer can be hardly sputtered, thus making it possible to secure a sufficient etching resistance irrespective of the kinds of etchant to be employed. As a result, the generation of cutout or recession of the shoulder portion of mask material pattern can be prevented, thus making it possible to work the work film while assuring an excellent dimension controllability thereof. It is possible in this working step to remove the resist pattern and to perform the etching of the work film using only the interlayer pattern and the mask material pattern as an etching mask.

Finally, in the same manner where the interlayer is not employed, the resist pattern and the mask material pattern left after the etching are removed.

As explained above, according to this second pattern-forming method, a mask material containing a specific network carbon polymer is formed below the resist film. Further, since the mask material layer to be formed according to this invention is excellent in etching resistance, it is possible to work a work film while assuring an excellent anisotropic etching of the work film even if the film thickness of a resist film is reduced. Moreover, the mask material can be normally coated in a wet method and the resultant mask material layer thus formed can be removed by means of an ashing treatment after finishing the working of the work film.

Additionally, since the mask material layer is transparent to the alignment light, a resist pattern can be formed while ensuring a high alignment precision in relative to an underlying pattern.

Next, a third pattern-forming method according to this invention will be explained in details with reference to the drawings.

FIGS. 5A to 5D and FIGS. 6A to 6D illustrate cross-sectional views illustrating the steps in the third pattern-forming method according to this invention.

Figure 5A:
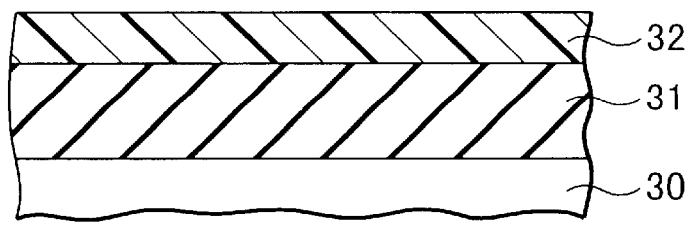
FIGS. 5A to 5D illustrate cross-sectional views illustrating another example of steps in the pattern-forming method according to this invention.

First of all, as shown in FIG. 5A, an anti-reflective film 32 is formed on a work film 31 formed in advance on the surface of a wafer substrate 30. As for the work film, it is possible to employ, though not limitative, the same kinds of materials as employed in the aforementioned first pattern-forming method.

This anti-reflective film 32 can be formed to have a predetermined film thickness by using a material as will be explained hereinafter.

Figure 5B:
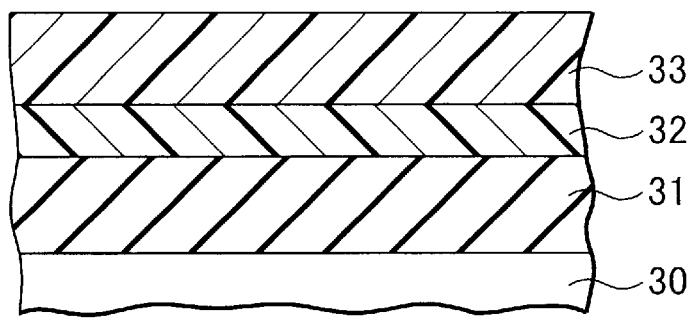

Then, a resist solution is coated on the anti-reflective film 32 by means of a spin-coating method for instance to thereby form a film of coating, which is then heated by means of a hot plate or an oven so as to evaporate the solvent, thus forming a resist film 33 as shown in FIG. 5B. With respect to the resist composition for forming the resist film 33, the method of forming the resist film 33 and the film thickness of the resist film 33, they may be the same as those explained in the aforementioned first pattern-forming method.

Figure 5C:
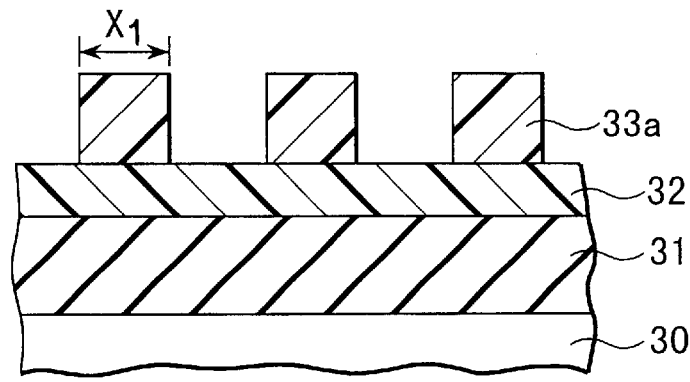

Thereafter, the resist film 33 is subjected to a patterning exposure treatment and then, to a development treatment to form a resist pattern 33a as shown in FIG. 5C. As for the light source of the exposure light and developing solution, they may be the same as employed in the aforementioned first pattern-forming method. If desired, it is also possible to perform, prior to the developing treatment, a post exposure bake by using a hot plate or oven.

It is possible in this third pattern-forming method to utilize the resist pattern 33a obtained in this manner as a matrix pattern. It is also possible in this case to interpose a resist underlying film such as an anti-reflective film or an antistatic film between the resist pattern 33a or the matrix pattern and the work film. Further, it is also possible in this third pattern-forming method to employ a matrix pattern comprising an anti-reflective film pattern or a sacrificial film pattern.

A matrix pattern comprising an anti-reflective film pattern can be formed by way of the following method. Namely, this method comprises the steps of; forming an anti-reflective film on a work film; forming a resist film on the anti-reflective film; forming a resist pattern by exposing the resist film to a patterning exposure light and by developing the exposed resist film; and forming an anti-reflective film pattern by transferring the resist pattern to the anti-reflective film. As for the etching method to be employed for forming the anti-reflective film pattern, a reactive ion etching, a magnetron type reactive ion etching, an electron beam ion etching, an ICP etching or ECR ion etching may be employed. Namely, there is not any particular limitation on this etching method as long as it is possible to perform a fine etching process.

As for the material for forming the anti-reflective film, there is not any particular limitation as long as the complex index of refraction of the anti-reflective film at an exposure wavelength is in the range of $1.0 \leq n \leq 2.5$; and $0.05 \leq k \leq 1.0$. For example, it may be selected, as such a material, from a metal oxide such as tungsten oxide, titanium oxide and aluminum oxide; an organic group modified metal oxide such as organic group modified tungsten oxide, organic group modified titanium oxide and organic group modified aluminum oxide; and an organic compound such as polysilane, polysilene, polysiloxane, polysilazane, polyimide, polyamide, polysulfone, polystyrene, novolak and polyvinylphenol.

A material selected from these compounds is then dissolved in an organic solvent such as a ketone type solvent such as acetone, methylethyl ketone, methylisobutyl ketone and cyclohexanone; a Cellosolve type solvent such as methyl Cellosolve, methyl Cellosolve acetate and ethyl Cellosolve acetate; an ester type solvent such as ethyl lactate, ethyl acetate, butyl acetate and isoamyl acetate; alcohol type solvent such as methanol, ethanol and isopropanol; anisol; toluene; xylene; naphtha to prepare a solution.

The solution thus obtained is then coated on a wafer substrate by means of a spin-coating method and then heated by means of a hot plate or an oven, thus forming an anti-reflective film. Although the employment of the anti-reflective film which can be formed by using these coating methods is preferable because of the easiness in forming it into a film, it is also possible to employ $SiO_xN_yC_z$ ($0 \leq x \leq 5$; $0 \leq y \leq 5$; $0 \leq z \leq 5$) or carbon, which can be formed into a film by means of a sputtering method, a vapor deposition method or a CVD method. Although there is not any particular limitation, the film thickness of the anti-reflective film should preferably be in the range of 10 to 5,000 nm. Because, if the film thickness of the anti-reflective film is less than 10 nm, it becomes impossible to sufficiently inhibit the reflection of light, whereas if the film thickness of the anti-reflective film exceeds over 5,000 nm, it will lead to the generation of an etch bias on the occasion of etching the anti-reflective film, thereby making it difficult to work the work film while limiting the conversion difference in dimension.

A matrix pattern comprising a sacrificial film pattern can be formed by way of the following method. Namely, the method comprises the steps of; forming a sacrificial film on the work film; forming an anti-reflective film on the sacrificial film; forming a resist film on the anti-reflective film; forming a resist pattern by exposing the resist film to a patterning exposure light and by developing the exposed resist film; and forming an anti-reflective film pattern and a sacrificial film pattern by transferring the resist pattern to the anti-reflective film and the sacrificial film. As for the etching method to be employed for forming the sacrificial film pattern, a reactive ion etching, a magnetron type reactive ion etching, an electron beam ion etching, an ICP etching or ECR ion etching may be employed. Namely, there is not any particular limitation on this etching method as long as it is possible to perform a fine etching process. The conditions for etching these anti-reflective film and sacrificial film may be the same with or different from each other.

As for the material for forming the sacrificial film, there is not any particular limitation as long as it can be etched at a higher speed as compared with the speed of the resist pattern. Namely, the selectivity ratio between the resist pattern and the sacrificial film should preferably be such that the sacrificial film can be etched at least 1.5 times faster than the resist pattern. Because, if the etching speed of the sacrificial film is less than 1.5 times that of the resist pattern, the resist pattern may be erased out in the middle of the working step of the sacrificial film. Further, this sacrificial film may be absorptive to an exposure wavelength, thus enabling this sacrificial film to be functioned as an anti-reflective film. As a result, additional anti-reflective film may not be required to be formed on the sacrificial film, which is preferably in view of simplifying the manufacturing steps.

As for the material for forming the sacrificial film, it may be selected from a metal oxide such as tungsten oxide, titanium oxide and aluminum oxide; an organic group modified metal oxide such as organic group modified tungsten oxide, organic group modified titanium oxide and organic group modified aluminum oxide; and an organic compound such as polysilane, polysilene, polysiloxane, polysilazane, polyimide, polyamide, polysulfone, polystyrene, novolak and polyvinylphenol.

A material selected from these compounds is then dissolved in an organic solvent such as a ketone type solvent such as acetone, methylethyl ketone, methylisobutyl ketone and cyclohexanone; a Cellosolve type solvent such as methyl Cellosolve, methyl Cellosolve acetate and ethyl Cellosolve acetate; an ester type solvent such as ethyl lactate, ethyl acetate, butyl acetate and isoamyl acetate; alcohol type solvent such as methanol, ethanol and isopropanol; anisol; toluene; xylene; naphtha to prepare a solution.

The solution thus obtained is then coated on a wafer substrate by means of a spin-coating method and then heated by means of a hot plate or an oven, thus forming a sacrificial film. Although the employment of the sacrificial film which can be formed by using these coating methods is preferable because of the easiness in forming it into a film, it is also possible to employ a metal such as aluminum, tungsten and copper; $SiO_xN_yC_z$ ($0 \leq x \leq 5$; $0 \leq y \leq 5$; $0 \leq z \leq 5$) or carbon, which can be formed into a film by means of a sputtering method, a vapor deposition method or a CVD method. Although there is not any particular limitation, the film thickness of the sacrificial film should preferably be in the range of 50 to 5,000 nm. Because, if the film thickness of the sacrificial film is less than 50 nm, it becomes impossible to form a matrix pattern having a high aspect ratio, whereas if the film thickness of the sacrificial film exceeds over 5,000 nm, it will lead to the generation of an etch bias on the occasion of etching the sacrificial film, thereby making it difficult to work the work film while limiting the etch bias.

Figure 5D:
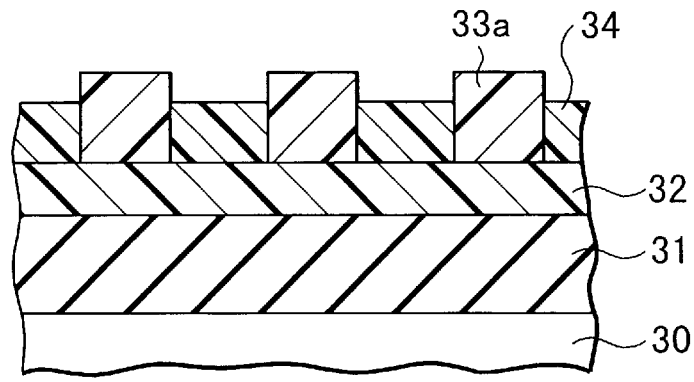

After the resist pattern 33a constituting the matrix pattern as explained above is formed, an opened space formed in the matrix pattern 33a is filled with a mask material layer 34 as shown in FIG. 5D. For the purpose of forming the mask material layer 34, a mask material containing a network carbon polymer having a repeating unit represented by the aforementioned general formulas (CP1) to (CP4) is dissolved in a predetermined organic solvent to obtain a solution of mask material.

As for the organic solvent useful in this case are, there is not any particular limitation as long as it is capable of dissolving the resist pattern. For example, it is possible to employ a ketone type solvent such as acetone, methylethyl ketone, methylisobutyl ketone and cyclohexanone; a Cellosolve type solvent such as methyl Cellosolve, methyl Cellosolve acetate and ethyl Cellosolve acetate; an ester type solvent such as ethyl lactate, ethyl acetate, butyl acetate and isoamyl acetate; alcohol type solvent such as methanol, ethanol and isopropanol; anisol; toluene; xylene; naphtha; etc. The solution thus obtained is then coated on the surface of the matrix pattern to form a film of coating.

When the top surface of the resist pattern 33a is covered by a mask material layer 34 as a result of coating of the solution on the resist pattern 33a, the portion of the mask material layer 34 that is left remained on the top surface of the resist pattern 33a should preferably be removed.

As for the weight average molecular weight of the network carbon polymer to be employed in the third pattern-forming method, it should preferably be in the range of 200 to 200,000, though there is not any particular limitation. Because, if the weight average molecular weight of the network carbon polymer is less than 200, the mask material would be dissolved by a solvent to be employed for the resist. On the other hand, if the weight average molecular weight of the network carbon polymer is more than 200,000, it becomes difficult to dissolve the mask material in an organic solvent, thus making it possible to difficult to prepare a solution. The network carbon polymer to be employed in this case is not limited to one kind, but may be formed of a mixture comprising a plural kinds of compounds.

Further, if desired, the solution of mask material may contain other components, such as an adhesion improver for improving the adhesivity of the mask material to a work film, a crosslinking agent, etc. that have been explained with reference to the first pattern-forming method.

After the solution of coating material has been formed as explained above, the solution is coated on the work film by means of a spin-coating method so as to fill an opened space formed in the matrix pattern 33a with the coating material. Since the network carbon polymer to be employed in this invention contains an organic group in its repeating unit, the coating material comprising this network carbon polymer can be easily dissolved in an organic solvent, and hence, the aforementioned filling can be executed normally.

Thereafter, the solvent included in the solution is allowed to evaporate by using a hot plate or an oven, thereby enabling the mask material layer 34 to be placed in an open space formed in the resist pattern 33a as shown in FIG. 5D.

Figure 6A:
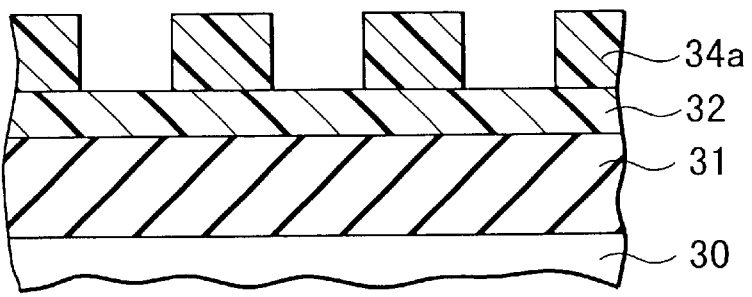
FIGS. 6A to 6D illustrate cross-sectional views illustrating another example of steps in the pattern-forming method according to this invention.

Thereafter, the resist pattern 33a is subjected to heating or the irradiation of energy beam so as to decompose the resist and then, to a development treatment so as to dissolve and remove the resist pattern 33a, thereby forming the mask material pattern 34a as shown in FIG. 6A. The heating in this case can be performed using a hot plate or an oven at a temperature ranging from 100 to 250° C. If the temperature is less than 100° C., the resist can be hardly decomposed, whereas if the temperature exceeds over 250° C., the crosslinking of the resist may be caused to generate.

As for the energy beam, it may be ultraviolet rays, X-rays, electron beam, ion beam, etc.

If the irradiation of ultraviolet rays is to be utilized in this case, it should preferably include a wavelength of not more than 450 nm and the irradiation dose should preferably be 0.1 mJ/cm$^2$ or more. Because, if the irradiation of ultraviolet rays is performed with a wavelength of more than 450 nm or with an irradiation dose of less than 0.1 mJ/cm$^2$, it becomes impossible to sufficiently achieve the evaporation or carbonization of the organic group in the mask material. If the irradiation of electron beam is to be utilized in this case, it is preferable to control the electron beam such that the accelerating voltage is within the range of 0.1 to 1,000 keV and the irradiation dose is within the range of 0.1 $\mu$C/cm$^2$ to 10,000 C/cm$^2$. Because, if the accelerating voltage is less than 0.1 keV, only the surface zone would be irradiated with the electron beam, whereas if the accelerating voltage exceeds over 1,000 keV, the electron beam would pass through the mask material, thereby extremely deteriorating the irradiation efficiency. On the other hand, if the irradiation dose is less than 0.1 $\mu$C/cm$^2$, it becomes impossible to sufficiently achieve the evaporation or carbonization of the organic group in the mask material. On the other hand, if the irradiation dose exceeds over 10,000 C/cm$^2$, it would lead to an increase in treatment time.

Figure 6B:
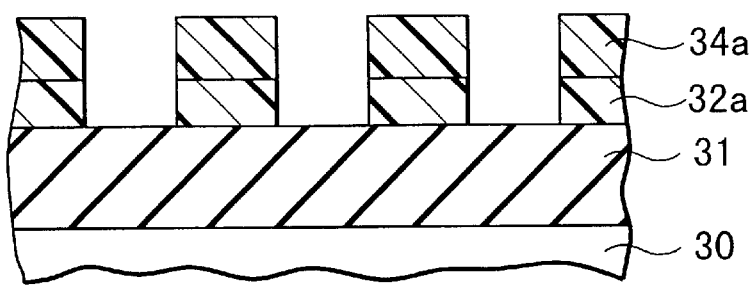

Next, the anti-reflective film 32 is etched by using the mask material pattern 34a as an etching mask to obtain an anti-reflective film pattern 32a as shown in FIG. 6B. There is any particular limitation regarding the etching method in this case, so that any of wet etching method or dry etching method can be employed. Even where a sacrificial film is formed below the anti-reflective film, it can be etched in the same manner as mentioned above, thereby forming a sacrificial film pattern.

Figure 6C:
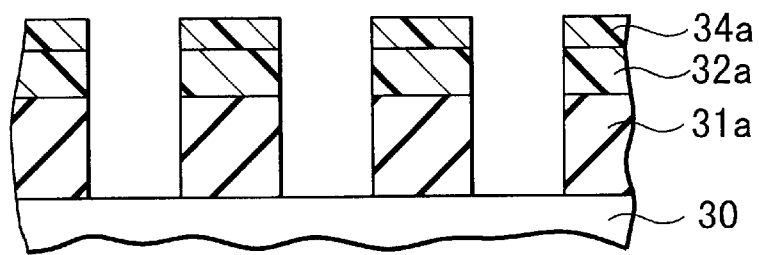

The anti-reflective film pattern 32a and mask material pattern 34a are then employed as an etching mask to dry-etch the work film 31, thereby transferring the mask material pattern 34a to the work film 31, thus forming a work film pattern 31a as shown in FIG. 6C.

Figure 6D:
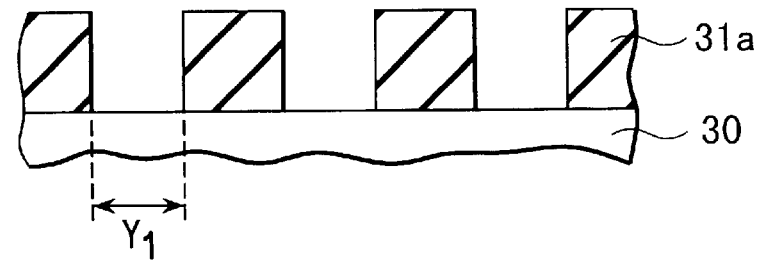

Finally, the residual mask material pattern 34a left after etching is removed to obtain a structure shown in FIG. 6D.

As explained above, according to this third pattern-forming method, since the mask material pattern is formed by filling the open space in the resist pattern with a mask material, it is possible to transfer the resist pattern to the mask material layer without generating an etch bias. Moreover, since the mask material to be employed herein contains a large quantity of carbon atom, a sufficient dry-etching resistance can be ensured by this mask material, thus making it possible to work a work film while assuring an excellent anisotropic etching of the work film.

By the way, the compound to be employed as a crosslinking agent in this invention may be employed either in the form of single compound or in the form of a composition containing the compound as a main component. A specific example of this compound is a polymer containing two or more conjugated multiple bonds or triple bonds, wherein the conjugated multiple bond includes benzocyclobutane structure.

Specific examples of this conjugated multiple bond are, though not limitative, polyyne structure, polyacetylene structure, polydiacetylene structure, enyne structure, cumulene structure and diene structure. Followings are specific examples of these structures.

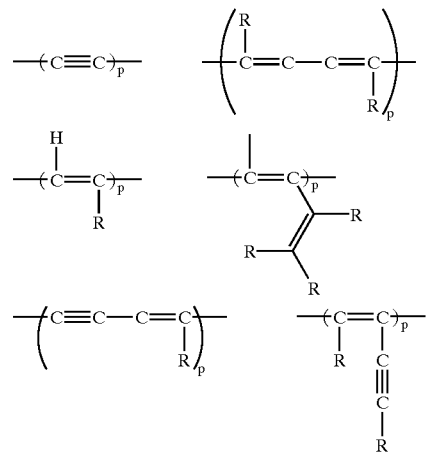

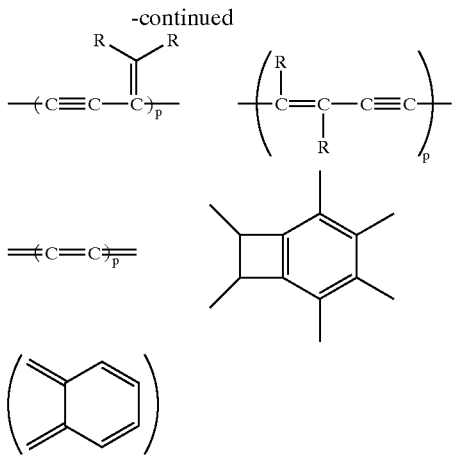

wherein p is a positive integer.

A film of coating containing any one of these compounds is formed on a substrate and then, heat-treated together with the irradiation of energy beam to crosslink the coated film, thereby forming an insoluble film. The energy beam to be employed in this case may be light, EB or X-rays. This insoluble film thus obtained has an anti-reflection property and other properties which are useful as an etching mask.

For the purpose of effectively curing the compounds mentioned above, a catalyst or a crosslinking agent may be incorporated into the compounds. The catalyst should preferably be a radical-generating agent. As for the crosslinking agent, any kinds of compounds can be optionally selected as far as the compounds include in their molecules two or more of groups selected from multiple bond, S—S bond, S—H bond and Si—H bond.

It is also possible to form the aforementioned mask material layer by using a petroleum-based or coal-based pitch that can be employed as a crosslinking agent of this invention. The petroleum-based or coal-based pitch to be employed in this case is formed, through separation and refining, of a component which is soluble in particular in an aromatic or aliphatic hydrocarbon solvent. A film of coating comprising this refined pitch will be formed on a substrate and then, heat-treated together with the irradiation of energy beam to crosslink the coated film, thereby forming an insoluble film. The energy beam to be employed in this case may be light, EB or X-rays. This insoluble film thus obtained has an anti-reflection property and other properties which are useful as an etching mask. Further, due to the application of energy beam irradiation, the heat resistance and solvent resistance of the insoluble film can be also enhanced.

As in the case of the compounds having a conjugated multiple bond, a catalyst or a crosslinking agent may be incorporated into the petroleum-based or coal-based pitch. The catalyst to be employed should preferably be a radical-generating agent. As for the crosslinking agent, any kinds of compounds can be optionally selected as far as the compounds include in their molecules two or more of groups selected from multiple bond, S—S bond, S—H bond and Si—H bond.

Even when these compounds are employed in the formation of the mask material layer by means of the aforementioned first, second or third pattern-forming method, it is possible to work the work film while ensuring an excellent anisotropy and to obtain almost the same effects as mentioned above.

This invention will be further explained with reference to the following specific examples.

EXAMPLE I

This example explains the first pattern-forming method.

Example I-1

This example will be explained with reference to FIGS. 1A to 1C and FIGS. 2A to 2C.

First of all, an $SiO_2$ film 11 having a film thickness of 300 nm was formed on a silicon wafer 10 by means of a sputtering method. Then, a metal wiring layer 15 was formed as a work film on the $SiO_2$ film 11 by means of a sputtering method. This metal wiring layer 15 is formed of a laminate structure comprising a TiN film 12 (film thickness: 40 nm), a Ti film 13 (film thickness: 5 nm), 0.5% Cu—Al film 14 (film thickness: 230 nm), a Ti film 13 (film thickness: 10 nm) and a TiN film 12 (film thickness: 20 nm), which were successively formed in the mentioned order.

Then, a mask material layer 16 as shown in FIG. 1A was formed on the metal wiring layer 15 (the work film) according to the following procedures (S1) to (S6).

(S1) 1 g of the compound represented by the aforementioned chemical formula [CP1-1] (p/o=1/1) and having a weight average molecular weight 12,000 was employed as a network carbon polymer and dissolved in 9 g of cumene to prepare a solution of mask material. This solution of mask material was coated on the surface of the work film (metal wiring layer) 15 by means of a spin-coating method, and was heated for 60 seconds at a temperature of 330° C. in a nitrogen atmosphere (oxygen concentration: 50 ppm or less), thereby forming a mask material layer.

(S2) 0.9 g of the compound represented by the aforementioned chemical formula [CP1-13] (o/p/q=1/1/1) and having a weight average molecular weight 1,000 was employed as a network carbon polymer and dissolved in 9 g of cumene to prepare a solution of mask material. Thereafter, in the same manner as in the case of the aforementioned (S1) except that a solution of this mask material was employed, a mask material layer was formed.

(S3) 0.9 g of the compound represented by the aforementioned chemical formula [CP2-1] (o/p/q=1/1/1) and having a weight average molecular weight 1,000 was employed as a network carbon polymer and dissolved in 9 g of cumene to prepare a solution of mask material. Thereafter, in the same manner as in the case of the aforementioned (S1) except that a solution of this mask material was employed, a mask material layer was formed.

(S4) 0.9 g of the compound represented by the aforementioned chemical formula [CP3-1] and having a weight average molecular weight 1,500 as a network carbon polymer and 0.1 g of the compound represented by the aforementioned chemical formula [LK-5] as a crosslinking agent were dissolved in 9 g of cumene to prepare a solution of mask material. Thereafter, in the same manner as in the case of the aforementioned (S1) except that a solution of this mask material was employed, a mask material layer was formed.

(S5) 0.9 g of the compound represented by the aforementioned chemical formula [CP3-12] (o/p/q=1/1/1) and having a weight average molecular weight 1,400 was employed as a network carbon polymer and dissolved in 9 g of cumene to prepare a solution of mask material. Thereafter, in the same manner as in the case of the aforementioned (S1) except that a solution of this mask material was employed, a mask material layer was formed.

(S6) 0.9 g of the compound represented by the aforementioned chemical formula [CP4-5] and having a weight average molecular weight 1,300 as a network carbon polymer, 0.1 g of the compound represented by the aforementioned chemical formula [LK-5] as a crosslinking agent, and 0.05 g of silyl peroxide as a crosslinking promotor were dissolved in 9 g of cumene to prepare a solution of mask material. Thereafter, in the same manner as in the case of the aforementioned (S1) except that a solution of this mask material was employed, a mask material layer was formed.

The film thickness of each mask material layer was 300 nm.

When the condition of the film of coating was visually observed, all of the mask material layers were found as being normally coated. Further, the surface of each mask material layer was investigated with respect to the roughness thereof by using an atomic force microscope. The results measured on the difference between the top and bottom of the rugged surface are shown in the following Table 1.

All of the mask material layers indicated a surface roughness of 1 nm or less in height, which is smaller than the tolerance precision, thus indicating a flat film. The complex index of refraction of mask material layer to ArF excimer laser of 193 nm wavelength which was employed as an exposure light was measured by using an ellipsometer, the results obtained being shown in the following Table 1.

TABLE 1

| Method of forming mask | Surface roughness [nm] | n, k value (193 nm) | Etching rate [nm/min.] | Taper angle [°] |
|---|---|---|---|---|
| (S1) | <1 | n = 1.68, k = 0.24 | 51 | 87 |
| (S2) | <1 | n = 1.72, k = 0.32 | 52 | 85 |
| (S3) | <1 | n = 1.72, k = 0.35 | 49 | 85 |
| (S4) | <1 | n = 1.68, k = 0.25 | 50 | 85 |
| (S5) | <1 | n = 1.70, k = 0.32 | 49 | 85 |
| (S6) | <1 | n = 1.71, k = 0.35 | 50 | 85 |
| (R1) | <1 | n = 1.29, k = 0.71 | 51 | 86 |
| (R2) | 35 | n = 1.39, k = 0.56 | — | — |
| (R3) | 12 | n = 1.41, k = 0.52 | — | — |
| (R4) | <1 | — | 78 | 78 |

Since all of the mask material layers exhibited light absorption to the light of 193 nm wavelength, the mask material layers were found effective as an anti-reflective film for inhibiting the reflection of exposure light from the work film to the resist film.

Then, the resist solution was coated on each of the mask material layers 16 by means of a spin-coating method, and was baked over a hot plate at a temperature of 140° C. for 90 seconds, thus forming the resist film 17 as shown in FIG. 1B. The resist solution employed in this example was a chemical amplification type positive resist wherein 9.9 g of the compound [P-1] having a weight average molecular weight 12,000 as an inhibiting resin and 0.1 g of the compound [PAG-1] as an acid-generating agent were dissolved in 90 g of ethyl lactate. Followings are the compounds employed herein.

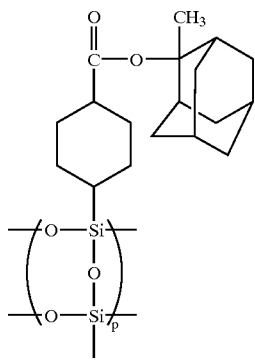
[P-1]

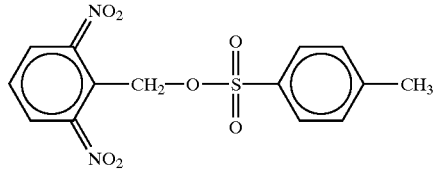
[PAG-1]

The film thickness of the resist film 17 thus obtained was 150 nm.

This resist film 17 was then subjected to a patterning exposure by using an exposure apparatus employing ArF excimer laser as a light source, and was baked for 90 seconds at a temperature of 140° C. by using a hot plate. The resist film 17 thus baked was then subjected to a developing treatment by using 0.21N tetramethyl ammonium hydroxide, thereby forming a resist pattern 17a of 0.13 μm line-and-space pattern as shown in FIG. 1C.

When the cross-section of the resist pattern 17a was observed by means of a scanning type electron microscope, the generation of a corrugated shape due to a standing wave was not recognized on the surface of every mask material layers, thus indicating an effective suppression of reflection of light from the underlying substrate.

Thereafter, a magnetron type reactive ion etching apparatus was employed to etch the mask material layer 16 so as to transfer the resist pattern 17a to the mask material layer, thus forming the mask material pattern 16a as shown in FIG. 2A. The etching conditions employed herein were; 100 sccm in flow rate of source gas ($O_2$), 40 mTorr in vacuum degree, 3.0 W/cm² in exciting power density, and 30° C. in substrate temperature. The etching time was set to such that the mask material layer is over-etched by 30% in relative to the end point of etching that can be detected by a plasma emission.

Further, a magnetron type reactive ion etching apparatus was employed to etch the metal wiring layer (work film) 15 so as to transfer the mask material pattern 16a to the metal wiring layer 15, thus forming the metal wiring pattern 15a as shown in FIG. 2B. The etching conditions employed herein were; 100/30 sccm in flow rate of source gas ($BCl_3$/$Cl_2$), 40 mTorr in vacuum degree, 3.0 W/cm² in exciting power density, and 30° C. in substrate temperature. The etching time was set to such that the mask material layer is over-etched by 30% in relative to the end point of etching that can be detected by a plasma emission.

The etching rate of the mask material pattern 16a was investigated by suspending the etching in the middle thereof, the results being summarized in the aforementioned Table 1. The etching rate of the 0.5% Cu—Al film 14 was 520 nm/min, whereas the etching rate of the mask material layer 16 was sufficiently lower as compared with that of the 0.5% Cu—Al film 14, thus proving that the mask material layer 16 is useful as a mask.

Finally, the portion of the mask material pattern 16a that was left after the etching of the metal wiring layer 15 was removed by using a down-flow type asher to thereby obtain a structure as shown in FIG. 2C. The etching conditions employed herein were; 100 sccm in flow rate of source gas ($O_2$), 40 mTorr in vacuum degree, 1,500W in power and 30° C. in substrate temperature. As a result, the mask material pattern could be removed without leaving any residue. When the cross-section of the metal oxide film pattern after the removal of the mask material pattern was observed by means of a scanning type electron microscope, the taper angle TP of the metal wiring pattern 15a as defined in FIG. 2C was 85 degrees or more in any of the mask material layers 26 that had been formed by the methods of (S-1) to (S-6), thus satisfying the tolerance value of 85 degrees and hence, indicating an excellent anisotropic work of the mask material layers 26. This can be ascribed to the fact that the mask materials employed according to this invention were excellent in etching resistance.

Comparative Example I-1

By way of the following procedures (R1) to (R4), a mask material layer having a thickness of 300 nm was formed on a work film formed in advance by the aforementioned method of Example I-1.

(R1) By means of a DC magnetron sputtering method where graphite carbon was employed as a target in an Ar atmosphere, a mask material layer having a film thickness of 400 nm was formed on the surface of the work film. The conditions for forming this mask material layer 250° C. in substrate temperature, $4\times10^{-3}$ Torr in pressure, 3.5 W/cm$^2$ in power density, and 40 sccm in flow rate of argon gas.

(R2) 0.5 g of carbon black was dispersed in 9 g of ethyl lactate to prepare a dispersion. Thereafter, 0.5 g of polysulfone was dissolved in this dispersion to prepare a solution of mask material, which was coated on the surface of a work film by means of a spin-coating method and then heated by using a hot plate at a temperature of 200° C. for 60 seconds to form a mask material layer.

(R3) 0.2 g of fullerene ($C_{60}$) was dispersed in 9 g of ethyl lactate to prepare a dispersion. Thereafter, 0.8 g of polyhydrostyrene having a weight average molecular weight of 12,000 was dissolved in this dispersion to prepare a solution of mask material, which was coated on the surface of a work film by means of a spin-coating method and then heated by using a hot plate at a temperature of 200° C. for 60 seconds to form a mask material layer.

(R4) 1 g of novolak resin having a weight average molecular weight 12,000 was dissolved in 9 g of ethyl lactate to prepare a solution of mask material, which was then coated on the surface of a work film by means of a spin-coating method and heated by using a hot plate at a temperature of 350° C. for 60 seconds to form a mask material layer.

When the condition of the surfaces of mask material layers formed by the aforementioned procedures (R2) and (R3) was visually observed, all of the mask material layers were found as having a striation, thus failing to coat them normally. Further, the surface of each mask material layer was investigated with respect to the roughness thereof by using the same method as employed in the aforementioned Example (I-1), the measured results being summarized in Table 1. Although it was possible to obtain a flatness which is 1 nm or less in difference of height in the case of the surfaces of mask material layers which were formed according to the aforementioned procedures (R1) and (R4), the mask material layers which were formed according to the aforementioned procedures (R2) and (R3) indicated a surface roughness having a height of 10 to 30 nm, thus failing to obtain a film of flat surface.

The reason for failing to normally coat the solution of mask material in the cases of the aforementioned procedures (R2) and (R3) may be ascribed to the fact that the solubility of carbon black and fullerene to the organic solvent was low. Further, the complex index of refraction of these mask material layers at 193 nm wavelength was also measured, the results obtained being shown in the above Table 1.

Since all of the mask material layers obtained through (R-1) to (R-4) exhibited light absorption to the light of 193 nm wavelength, the mask material layers were found effective as an anti-reflective film as in the case of the aforementioned Example (I-1).

Then, by using mask material layers formed according to the aforementioned procedures (R1) and (R4) which enabled to obtain a film of coating having a flat surface, the working of a metal wiring layer was performed.

Namely, a resist pattern was formed at first on the surface of the mask material layer, and then, the mask material layer was etched, thereby transferring the resist pattern to the mask material layer, thus forming a mask material pattern. Then, the etching of the metal wiring layer was performed so as to transfer the mask material pattern to the metal wiring layer. These steps were performed under the same conditions as those of the aforementioned Example (I-1). The etching rate of the mask material pattern was investigated by suspending the etching in the middle thereof, the results being summarized in the aforementioned Table 1.

The mask material layer formed in Example (I-1) was found as having an etching resistance 1.4 times higher than that of novolak resin, i.e. an etching resistance which is almost comparable to that of sputtered carbon. Further, the resist pattern and mask material layer which were left after the etching were removed in the same manner as employed in the aforementioned Example (I-1).

Then, the cross-section of the metal wiring layer after the removal of the mask material layer was observed by means of a scanning type electron microscope to measure the taper angle TP of the metal wiring layer as defined in FIG. 2C, the results being shown in Table 1. The taper angle obtained when the novolak resin was employed as a mask material layer was found as being lower than 85 degrees or the tolerance value, thus failing to perform an excellent anisotropic work of the mask material layer. It will be seen that when the network carbon polymer was employed as a mask material layer according to this invention, it was possible to perform an excellent anisotropic work of the mask material layer, which is almost comparable to that when a sputtered carbon is employed.

As explained above, by using the thin film-working method using an organic mask material which can be coated normally by means of a wet coating method, it now becomes possible to anisotropically work a work film in a desired manner even if the film thickness of resist film is thinned.

Example I-2

This example will be explained with reference to FIGS. 7A to 7C, FIGS. 8A to 8C, and FIGS. 9A to 9B.

First of all, in the same manner as Example I-1, a TEOS oxide film 11 and a metal wiring layer 15 were formed successively on a silicon wafer 10.

Figure 7A:
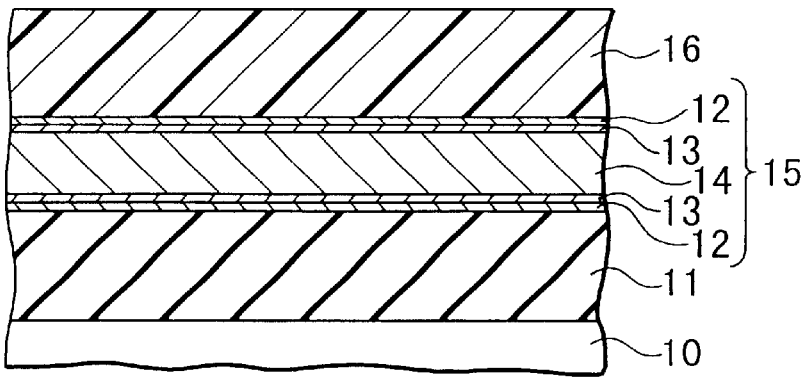
FIGS. 7A to 7C illustrate cross-sectional views illustrating another example of steps in the pattern-forming method according to this invention.

Then, a mask material layer 16 as shown in FIG. 7A was formed on the metal wiring layer 15 (the work film) according to the aforementioned procedures (S1) to (S6) as illustrated in the aforementioned Example I-1. The film thickness of each mask material layer 16 after the baking was 300 nm.

Figure 7B:
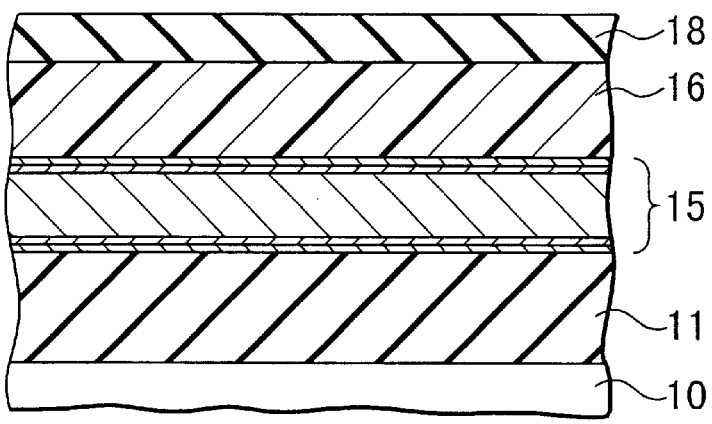

Thereafter, a solution for forming an interlayer was coated on the surface of each mask material layer 16 to obtain a coated layer, which was then baked over a hot plate at a temperature of 250° C. for 90 seconds to form the interlayer 18 as shown in FIG. 7B. The film thickness of this interlayer was 100 nm. The material employed for this interlayer was a solution which was prepared by dissolving 10g of a silicone compound represented by the following chemical formula [S-1] and having a molecular weight of 2,000 in 90 g of ethanol.

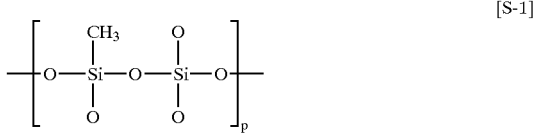

[S-1]

Figure 7C:
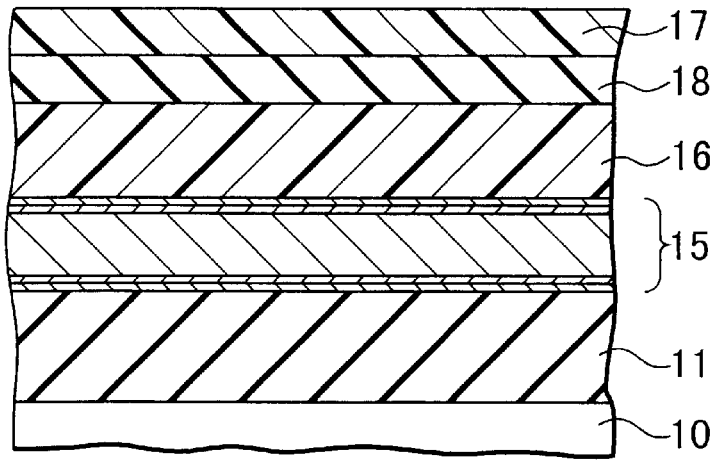

A solution of resist was coated on this interlayer 18 by means of a spin-coating method to obtain a coated layer, which was then baked over a hot plate at a temperature of 140° C. for 90 seconds to form a resist film 17 as shown in FIG. 7C. The film thickness of this resist film 17 was 150 nm. The solution of resist employed in this case was a chemical amplification type positive resist wherein 9.9 g of the compound [P-2] having a weight average molecular weight 12,000 as an inhibiting resin and 0.1 g of the compound [PAG-2] as an acid-generating agent were dissolved in 90 g of ethyl lactate. Followings are the compounds employed herein.

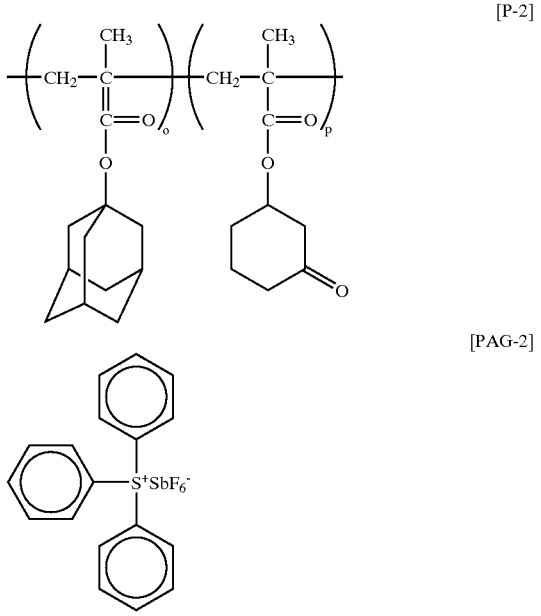

[P-2]

[PAG-2]

Figure 8A:
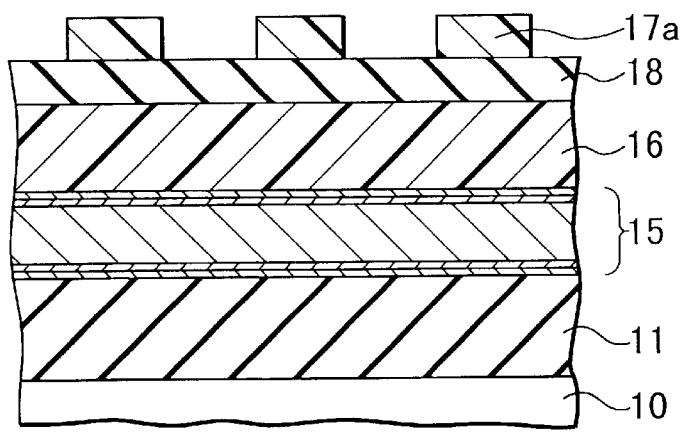
FIGS. 8A to 8C illustrate cross-sectional views illustrating another example of steps in the pattern-forming method according to this invention.

This resist film 17 was then subjected, in the same manner as Example I-1, to a patterning exposure by using an exposure apparatus employing ArF excimer laser as a light source, and was baked for 90 seconds at a temperature of 140° C. by using a hot plate. The resist film 17 thus baked was then subjected to a developing treatment by using 0.21N tetramethyl ammonium hydroxide (developing solution), thereby forming a resist pattern 17a of 0.13 μm line-and-space pattern as shown in FIG. 8A.

When the cross-section of the resist pattern 17a was observed by means of a scanning type electron microscope, the generation of a corrugated shape due to a standing wave was not recognized on the surface of every mask material layers, thus indicating an effective suppression of reflection of light from the underlying substrate.

Figure 8B:
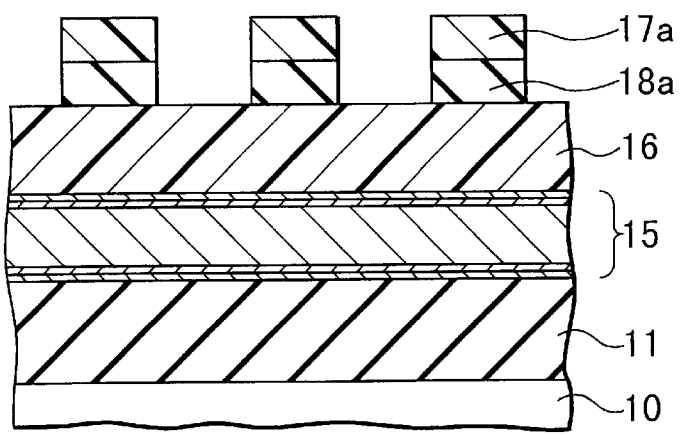

Thereafter, a magnetron type reactive ion etching apparatus was employed to etch the interlayer 18 so as to transfer the resist pattern 17a to the interlayer 18, thus forming the interlayer pattern 18a as shown in FIG. 8B. The etching conditions employed herein were; 30/100/100 sccm in flow rate of source gas ($CF_4/O_2/Ar$), 40 mTorr in vacuum degree, 3.0 W/cm$^2$ in exciting power density, and 30° C. in substrate temperature. The etching time was set to such that the mask material layer is over-etched by 30% in relative to the end point of etching that can be detected by a plasma emission.

Figure 8C:
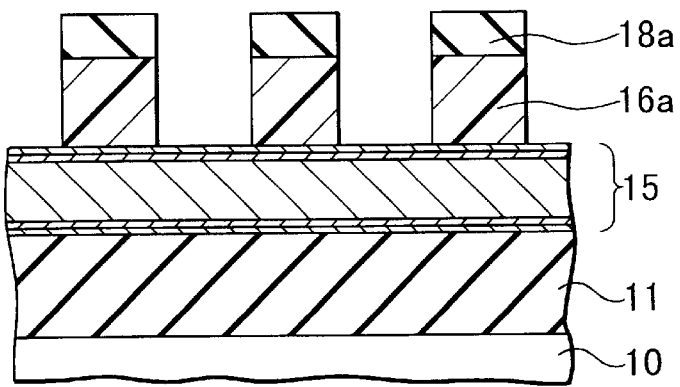

Thereafter, a magnetron type reactive ion etching apparatus was employed to etch the mask material layer 16 so as to transfer the interlayer pattern 18a to the mask material layer, thus forming the mask material pattern 16a as shown in FIG. 8C. The etching conditions employed herein were; 100 sccm in flow rate of source gas ($O_2$), 40 mTorr in vacuum degree, 3.0 W/cm$^2$ in exciting power density, and 30° C. in substrate temperature. The etching time was set to such that the mask material layer is over-etched by 30% in relative to the end point of etching that can be detected by a plasma emission.

Figure 9A:
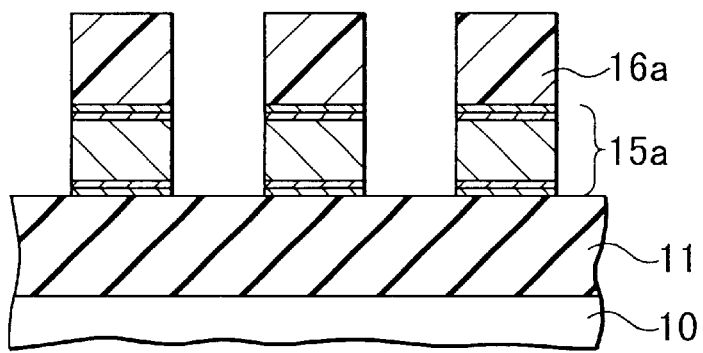
FIGS. 9A to 9B illustrate cross-sectional views illustrating another example of steps in the pattern-forming method according to this invention.
Figure 9B:
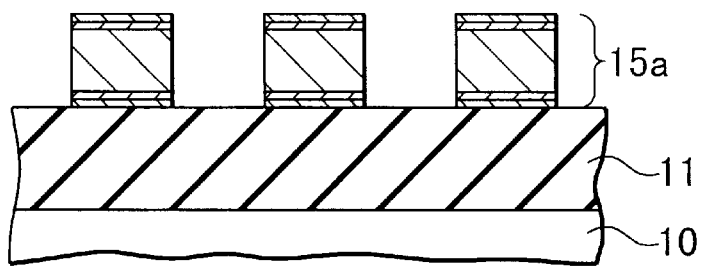

Further, the metal wiring layer 15 was etched so as to transfer the mask material pattern 16a to the metal wiring layer 15 as shown in FIG. 9A, and residual mask material pattern 16a was removed, thus obtaining a structure as shown in FIG. 9B. The etching of the metal wiring layer 15 and the removal of residual mask material pattern 16a were performed under the same conditions as employed in Example I-1.

When the cross-section of the metal oxide film pattern 15a after the removal of the mask material pattern was observed by means of a scanning type electron microscope so as to investigate the taper angle TP of the metal wiring pattern 15a as defined in FIG. 2C, an excellent anisotropic working of the mask material layer was confirmed as in the case of Example I-1. This can be ascribed to the fact that the mask materials employed herein according to this invention were excellent in etching resistance.

As explained above, since the organic mask material to be employed in this invention can be coated normally by means of a wet coating method, and moreover, since it has a sufficient etching resistance, it now becomes possible to anisotropically work a work film in a desired manner.

EXAMPLE II

This example explains the second pattern-forming method.

Example II-1

This example will be explained with reference to FIGS. 3A to 3C and FIGS. 4A to 4D.

First of all, an SiO$_2$ film 21 having a film thickness of 300 nm was formed on a silicon wafer 20 by means of a sputtering method. Then, a metal wiring layer 25 was formed on the SiO$_2$ film 21 by means of a sputtering method. This metal wiring layer 25 is formed of a laminate structure comprising a TiN film 22 (film thickness: 40 nm), a Ti film 23 (film thickness: 5 nm), 0.5% Cu—Al film 24 (film thickness: 230 nm), a Ti film 23 (film thickness: 10 nm) and a TiN film 22 (film thickness: 20 nm), which were successively formed in the mentioned order. This metal wiring layer 25 was provided in advance with an underlying pattern consisting of a groove pattern having a length of 10 μm, a width of 0.6 μm and a depth of 0.2 μm, this underlying pattern constituting an alignment mark AM.

After a TEOS oxide film 26 (work film) was formed on the metal wiring layer 25 by means of LPCVD method, an interlayer insulating film having a flat surface was formed by using a chemical mechanical polishing method. The depth from the surface of the metal wiring layer 25 to the interlayer insulating film was 400 nm.

Then, a mask material layer 16 as shown in FIG. 3A was formed on the TEOS oxide film 26 (the work film) according to the aforementioned procedures (S1) to (S6) as illustrated in the aforementioned Example I-1. The film thickness of each mask material layer 16 after the baking was 300 nm.

When the condition of the film of coating was visually observed, all of the mask material layers were found as being normally coated. Further, the surface of each mask material layer was investigated with respect to the roughness thereof by using an atomic force microscope. The results measured on the difference between the top and bottom of the rugged surface are shown in the following Table 2.

All of the mask material layers indicated a surface roughness of 1 nm or less in height, which is smaller than the tolerance precision, thus indicating a flat film. In this example, an ultraviolet ray having a wavelength of 248 nm was employed as an exposure light, and a visible radiation having a wavelength of 515 nm was employed as an alignment light which was used for detecting the underlying pattern. The complex index of refraction of mask material layer was measured by using an ellipsometer, the results obtained being shown in the following Table 2.

TABLE 2

| Method of forming mask layer | Surface roughness [nm] | n, k values (248 nm) | n, k values (515 nm) |
|---|---|---|---|
| (S1) | <1 | n = 1.72, k = 0.20 | n = 1.70, k = 0.00 |
| (S2) | <1 | n = 1.76, k = 0.28 | n = 1.70, k = 0.02 |
| (S3) | <1 | n = 1.76, k = 0.32 | n = 1.74, k = 0.00 |
| (S4) | <1 | n = 1.73, k = 0.22 | n = 1.72, k = 0.00 |
| (S5) | <1 | n = 1.75, k = 0.27 | n = 1.73, k = 0.01 |
| (S6) | <1 | n = 1.75, k = 0.31 | n = 1.74, k = 0.00 |
| (R1) | <1 | n = 1.33, k = 0.68 | n = 2.12, k = 0.62 |
| (R2) | 35 | n = 1.52, k = 0.48 | n = 2.08, k = 0.28 |
| (R3) | 12 | n = 1.52, k = 0.38 | n = 2.02, k = 0.23 |
| (R4) | <1 | n = 1.72, k = 0.35 | n = 1.59, k = 0.02 |

As shown in Table 2, since the mask material layers 27 exhibited light absorption to the light of 248 nm wavelength, the mask material layers were found effective as an anti-reflective film for inhibiting the reflection of exposure light from the work film to the resist film. Further, since the mask material layers 27 are transparent to the light of 515 nm wavelength, it is possible to detect the information on position of the alignment mark.

Then, the resist solution was coated on each of the mask material layers 27 by means of a spin-coating method, and was baked over a hot plate at a temperature of 110° C. for 90 seconds, thus forming the resist film 28 as shown in FIG. 3B. The resist solution employed in this example was a chemical amplification type positive resist wherein 9.9 g of polyvinylphenol (an inhibiting resin) having a weight average molecular weight 12,000, 30% of the hydroxyl group thereof being substituted by trimethylsilyl silane, and 0.1 g of the sulfoneimide (an acid-generating agent) were dissolved in 90 g of ethyl lactate.

The film thickness of the resist film 28 thus obtained was 150 nm.

Figure 10:
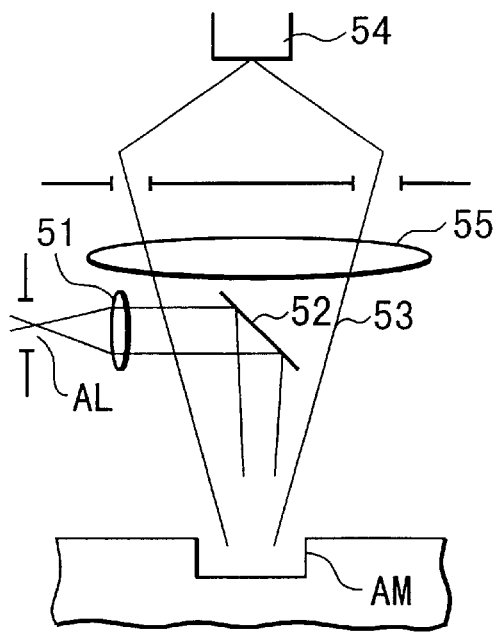
FIG. 10 is a schematic view showing an alignment optical system.

Then, by using a visual radiation of a wavelength of 515 nm as an alignment light AL, the detection of information on position of the alignment mark AM was performed as shown in FIG. 3C. In this detection of the information on position of the alignment mark AM, an optical system shown in FIG. 10 was employed to detect the light reflected from the alignment mark. Specifically, as shown in FIG. 10, the alignment light AL was irradiated through a lens 51 and a mirror 52 onto the alignment mark AM, while the reflection light 53 was allowed to reach a detector 54 through a lens 55.

Figure 11:
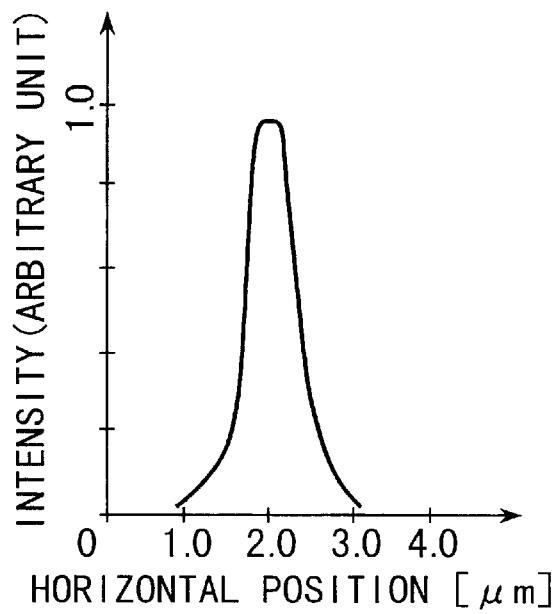
FIG. 11 is a graph showing a detected signal of alignment light.

As a result, by rendering the visual radiation to scan a region near the underlying pattern, the information on position could be detected at a high contrast. FIG. 11 shows a profile of signal intensity with respect to the mask material layer that had been formed by the method of (S1). The following Table 3 shows values of gain (=I/I$_0$) representing a ratio to be obtained by dividing an intensity I$_0$ of an incoming alignment light by a detected intensity I. The higher the k value of the mask material layer is, the more it becomes difficult to detect the underlying pattern due to the decrease of contrast. The reason for this may be ascribed to the fact that it becomes more difficult for the alignment light to pass through the mask material layer.

Then, on the basis of the detected information on the position, the position of pattern of the exposure was corrected. After finishing the correction of position, the resist film 28 was subjected to a patterning exposure by using an exposure apparatus employing ArF excimer laser as a light source. Then, the resist film 28 was baked for 90 seconds at a temperature of 110° C. by using a hot plate. The resist film 28 thus baked was then subjected to a developing treatment by using 0.21N developing solution, thereby forming a contact hole 28a having a diameter of 0.13 μm as shown in FIG. 4A.

When the cross-section of the resist pattern 28a was observed by means of a scanning type electron microscope, the generation of a corrugated shape due to a standing wave was not recognized on the side wall of the resist pattern 28a, thus indicating an effective suppression of reflection of light from the underlying substrate. The following Table 3 also shows the results measured of the magnitude of misregistration between the underlying pattern AM and the contact hole pattern. Every mask material layers indicated an excellent alignment with a precision of 10 nm or less which falls within the tolerance.

Thereafter, a magnetron type reactive ion etching apparatus was employed to etch the mask material layer 27 so as to transfer the resist pattern 28a to the mask material layer, thus forming the mask material pattern 27a as shown in FIG. 4B. The etching conditions employed herein were; 100 sccm in flow rate of source gas (O$_2$), 40 mTorr in vacuum degree, 3.0 W/cm$^2$ in exciting power density, and 30° C. in substrate temperature. The etching time was set to such that the mask material layer is over-etched by 30% in relative to the end point of etching that can be detected by a plasma emission.

Further, a magnetron type reactive ion etching apparatus was employed to etch the TEOS oxide film (work film) 26 so as to transfer the mask material pattern 27a to the TEOS oxide film 26, thus forming the work film pattern 26a as shown in FIG. 4C. The etching conditions employed herein were; 100/100/30 sccm in flow rate of source gas (CF$_4$/O$_2$/Ar), 40 mTorr in vacuum degree, 3.0 W/cm$^2$ in exciting power density, and 30° C. in substrate temperature. The etching time was set to such that the mask material layer is over-etched by 30% in relative to the end point of etching that can be detected by a plasma emission.

The etching rate of the mask material pattern was also investigated by suspending the etching in the middle thereof, the results of measurement being summarized in the following Table 3.

TABLE 3

| Method of forming mask | Contrast | Misregistration [nm] | Etching rate [nm/min.] | Taper angle [°] |
| --- | --- | --- | --- | --- |
| (S1) | 0.98 | 3 | 35 | 88 |
| (S2) | 0.93 | 3 | 37 | 86 |
| (S3) | 0.95 | 3 | 38 | 86 |
| (S4) | 0.96 | 2 | 39 | 86 |
| (S5) | 0.94 | 3 | 38 | 85 |
| (S6) | 0.93 | 3 | 37 | 86 |
| (R1) | 0.09 | 62 | 37 | 87 |
| (R2) | 0.18 | 23 | — | — |
| (R3) | 0.12 | 23 | — | — |
| (R4) | 0.95 | 3 | 59 | 78 |

The etching rate of the TEOS oxide film 26 was 320 nm/min, whereas the etching rate of the mask material pattern 27a was sufficiently lower as compared with that of the TEOS oxide film 26, thus proving that the mask material pattern 27a is useful as an etching mask.

Finally, the portion of the mask material pattern that was left after the etching of the TEOS oxide film 26 was removed by using a down-flow type asher to thereby obtain a structure as shown in FIG. 4D. The etching conditions employed herein were; 100 sccm in flow rate of source gas (O$_2$), 40 mTorr in vacuum degree, 1.5 W/cm$^2$ in exciting power density and 30° C. in substrate temperature. As a result, the mask material pattern could be removed without leaving any residue. When the cross-section of the TEOS oxide film pattern after the removal of the mask material pattern was observed by means of a scanning type electron microscope, the taper angle TP of the TEOS oxide film pattern as defined in FIG. 4D was 86 degrees in any of the mask material layers that had been formed by the methods of (S-1) to (S-6), thus satisfying the tolerance value of 85 degrees and hence, indicating an excellent anisotropic work of the mask material layers. This can be ascribed to the fact that the mask materials employed according to this invention were excellent in etching resistance.

In this example, the alignment mark AM was formed on the metal wiring layer 25. However, this alignment mark AM may be formed on the surface of the work film itself.

Comparative Example II-1

By way of the same procedures (R1) to (R4) as employed in Comparative Example I-1, a mask material layer having a thickness of 300 nm was formed on a work film formed in advance by the method of Example II-1.

When the condition of the surfaces of mask material layers formed by the procedures (R2) and (R3) was visually observed, all of the mask material layers were found as having a striation, thus failing to coat them normally. Further, the surface of each mask material layer was investigated with respect to the roughness thereof by using the same method as employed in the aforementioned Example (II-1), the measured results being summarized in Table 2. Although it was possible to obtain a flatness which is 1 nm or less in difference of height in the case of the surfaces of mask material layers which were formed according to the procedures (R1) and (R4), the mask material layers which were formed according to the aforementioned procedures (R2) and (R3) indicated a surface roughness having a height of 10 to 30 nm, thus failing to obtain a film of uniform film thickness.

The reason for failing to normally coat the solution of mask material in the cases of the afore-mentioned procedures (R2) and (R3) may be ascribed to the fact that the solubility of carbon black and fullerene to the organic solvent was low. Further, the complex index of refraction of these mask material layers at 193 nm and 515 nm wavelength was also measured, the results obtained being shown in the above Table 2.

Since all of the mask material layers obtained through (R-1) to (R-4) exhibited light absorption to the light of 193 nm wavelength, the mask material layers were found effective as an anti-reflective film as in the case of the aforementioned Example (II-1). However, since the mask material layers obtained through (R-1) to (R-4) are absorptive even to the light of 515 nm wavelength, the alignment light may be absorbed in the mask material layer.

Then, by using the same method as employed in Example II-1, a resist film was formed on the surface of each mask material layer, and then, the detection of information on position of the alignment mark was performed in the same manner as in Example II-1. Then, in the same manner as in Example II-1, the intensity of detected signal was measured to calculate the gain, the results being summarized in the aforementioned Table 3. As shown in Table 3, the contrast of the mask material layers formed by way of the methods of (R-1) to (R-3) was not more than 0.2 in any of these mask material layers, thus indicating a prominent decrease of contrast as compared with Example II-1.

Further, in the same manner as in Example II-1, on the basis of the detected information on the position, the position of pattern of the exposure was corrected. After finishing the correction of position, the resist film was subjected to a patterning exposure. Then, the post-exposure baking and development treatments of the resist film were successively performed in the same manner as in Example II-1, thereby forming a resist pattern.

Further, the magnitude of misregistration between the underlying pattern and the contact hole pattern was also measured, the results being shown in Table 3 shown above. Every mask material layers formed by way of the methods (R1) to (R3) indicated a misregistration exceeding over the tolerance value, i.e. 10 nm or more, thus failing to perform an alignment of high precision.

Thereafter, by using the mask material layers formed by way of the methods (R1) and (R4) which enabled to obtain a flat coated surface, the TEOS oxide film was worked.

Namely, a resist pattern was formed at first on the surface of the mask material layer, and then, the mask material layer was etched, thereby transferring the resist pattern to the mask material layer, thus forming a mask material pattern. Then, the etching of the TEOS oxide film was performed so as to transfer the mask material pattern to the TEOS oxide film. These steps were performed under the same conditions as those of the aforementioned Example (II-1). The etching rate of the mask material pattern was investigated by suspending the etching in the middle thereof, the results being summarized in the aforementioned Table 3.

The mask material layer formed in Example (II-1) was found as having an etching resistance 1.4 times higher than that of novolak resin, i.e. an etching resistance which is almost comparable to that of sputtered carbon. Further, the resist pattern and mask material layer which were left after the etching were removed in the same manner as employed in the aforementioned Example (II-1).

Then, the cross-section of the TEOS oxide film after the removal of the mask material layer was observed by means of a scanning type electron microscope to measure the taper angle TP of the TEOS oxide film as defined in FIG. 4D, the results being shown in Table 3. The taper angle obtained when the novolak resin was employed as a mask material layer was found as being lower than 85 degrees or the tolerance value, thus failing to perform an excellent anisotropic work of the mask material layer. It will be seen that when the network carbon polymer was employed as a mask material layer according to this invention, it was possible to perform an excellent anisotropic work of the mask material layer, which is almost comparable to that when a sputtered carbon is employed.

As explained above, since the organic mask material according to this invention can be coated normally by means of a wet coating method and moreover, is excellent in etching resistance, it now becomes possible to anisotropically work a work film in a desired manner.

Example II-2

This example will be explained with reference to FIGS. 12A to 12C, FIGS. 13A to 13C, and FIGS. 14A to 14C.

First of all, in the same manner as in Example II-1, an $SiO_2$ film 21 as an insulating film, a metal wiring layer 25 and a TEOS oxide film 26 as a work film were formed successively on a silicon wafer 20. As in the case of Example II-1, this metal wiring layer 25 was provided in advance with an underlying pattern consisting of a groove pattern having a length of 10 μm, a width of 0.6 μm and a depth of 0.2 μm, this underlying pattern constituting an alignment mark AM.

Figure 12A:
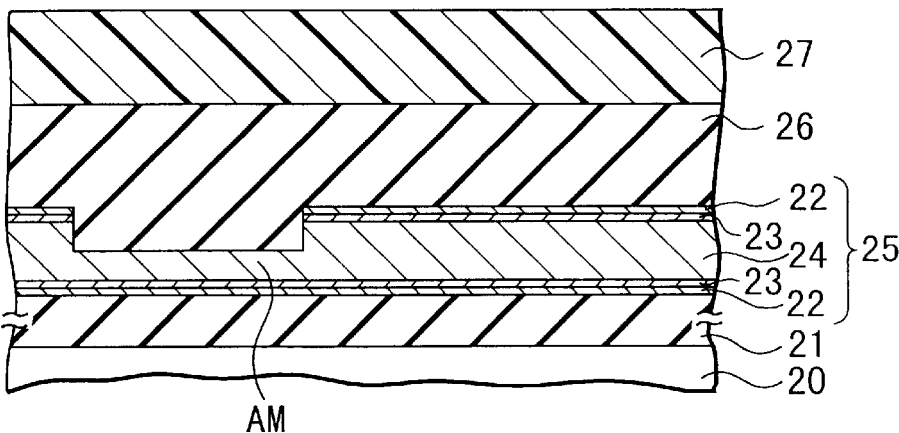
FIGS. 12A to 12C illustrate cross-sectional views illustrating another example of steps in the pattern-forming method according to this invention.

Then, a mask material layer 27 as shown in FIG. 12A was formed on the TEOS oxide film 26 (the work film) according to the aforementioned procedures (S1) to (S6) as illustrated in Example I-1. The film thickness of each mask material layer 16 after the baking was 300 nm.

Figure 12B:
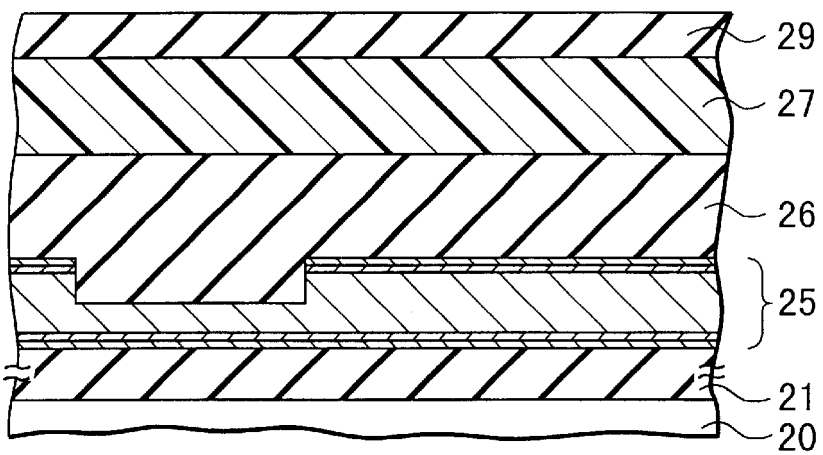

Thereafter, a solution for forming an interlayer was coated on the surface of each mask material layer 27 to obtain a coated layer, which was then baked over a hot plate at a temperature of 250° C. for 90 seconds to form the interlayer 29 as shown in FIG. 12B. The film thickness of this interlayer was 100 nm. The material employed for this interlayer was a solution which was prepared by dissolving 10 g of a silicone compound [S-1] as illustrated in Example I-2 having a molecular weight of 2,000 in a mixed solvent comprising 80 g of ethanol and 10 g of ethyl lactate. The complex index of refraction of this interlayer to a light of 515 nm wavelength to be employed as an alignment light was: n=1.49, k=0.01, i.e. almost transparent to the alignment light.

Figure 12C:
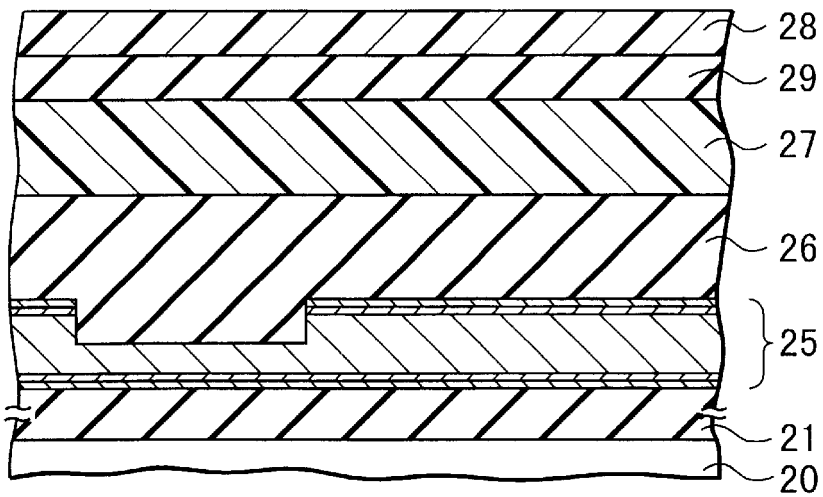

A solution of resist was coated on each interlayer 29 by means of a spin-coating method to obtain a coated layer, which was then baked over a hot plate at a temperature of 140° C. for 90 seconds to form a resist film 28 as shown in FIG. 12C. The solution of resist employed in this case was a chemical amplification type positive resist wherein 9.9 g of polyvinylphenol (having a weight average molecular weight of 12,000 and functioning as an inhibiting resin), 30% of hydroxyl group of which being substituted by tertiary butoxycarbonyl group, and 0.1 g of sulfoneimide as an acid-generating agent were dissolved in 90 g of ethyl lactate. The thickness of each resist film 28 thus obtained was 150 nm.

Figure 13A:
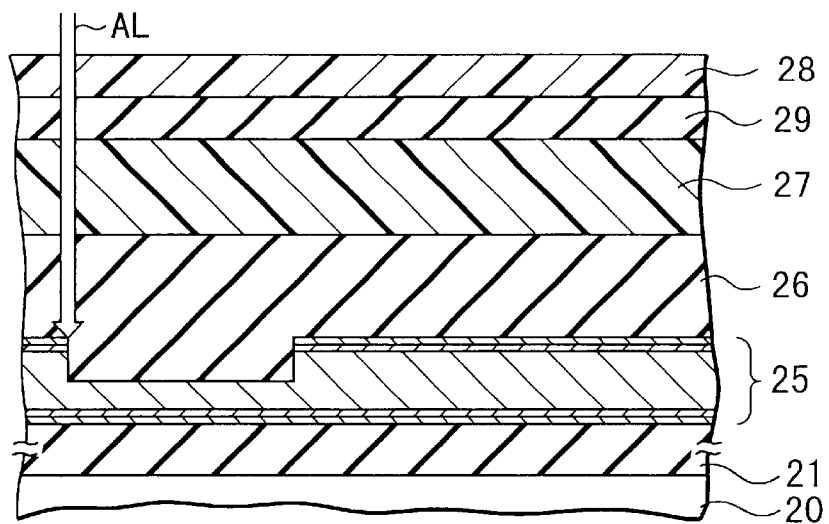
FIGS. 13A to 13C illustrate cross-sectional views illustrating another example of steps in the pattern-forming method according to this invention.

Then, as shown in FIG. 13A, the detection of information on position of the underlying pattern was performed in the same manner as in Example II-1. As a result, as in the case of Example II-1, it was possible to perform the detection of information on position of the underlying pattern with a high gain.

Figure 13B:
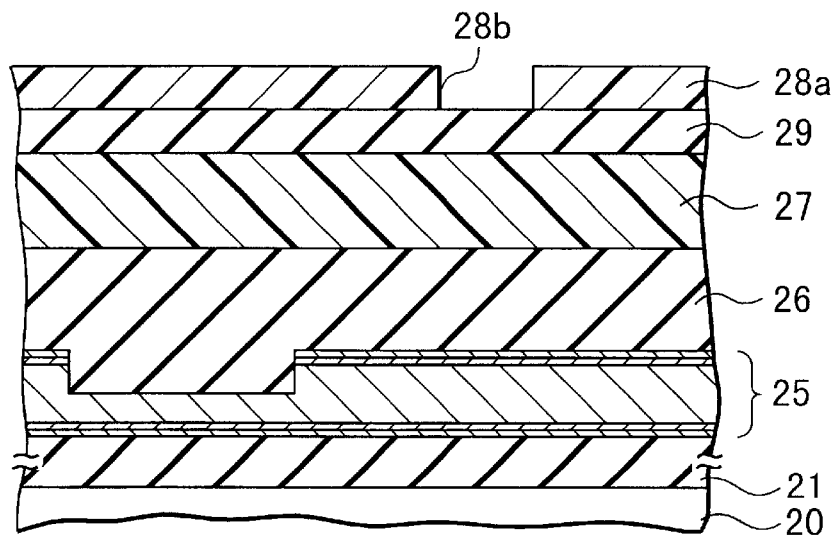

Then, on the basis of the detected information on the position, the position of pattern of the exposure was corrected. After finishing the correction of position, the resist film 28 was subjected to a patterning exposure by using an exposure apparatus employing ArF excimer laser as a light source. Then, the resist film 28 was baked for 90 seconds at a temperature of 110° C. by using a hot plate. The resist film 28 thus baked was then subjected to a developing treatment by using 0.21N developing solution, thereby forming a contact hole 28b having a diameter of 0.13 μm as shown in FIG. 13B.

When the cross-section of the resist pattern 28a was observed by means of a scanning type electron microscope, the generation of a corrugated shape due to a standing wave was not recognized on the side wall of the resist pattern 28a, thus indicating an effective suppression of reflection of light from the underlying substrate. The contact hole pattern was found as being aligned with the underlying pattern AM with a precision in position of 10 nm or less. It will be seen from this result that it is possible to realize a high alignment precision which is required in the manufacture of a semiconductor device of giga bit order.

Figure 13C:
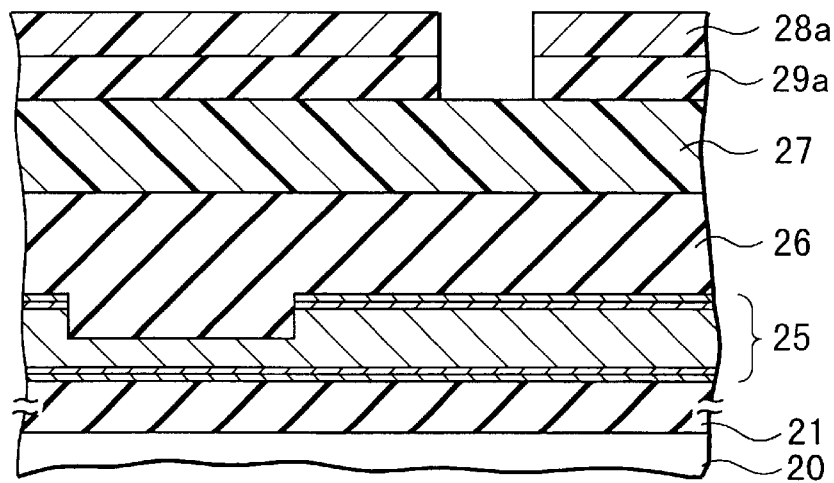

Thereafter, a magnetron type reactive ion etching apparatus was employed to etch the interlayer 29 so as to transfer the resist pattern 28a to the interlayer 29, thus forming the interlayer pattern 29a as shown in FIG. 13C. The etching conditions employed herein were; 30/100/100 sccm in flow rate of source gas ($CF_4/O_2/Ar$), 40 mTorr in vacuum degree, 3.0 W/cm$^2$ in exciting power density, and 30° C. in substrate temperature. The etching time was set to such that the mask material layer is over-etched by 30% in relative to the end point of etching that can be detected by a plasma emission.

Figure 14A:
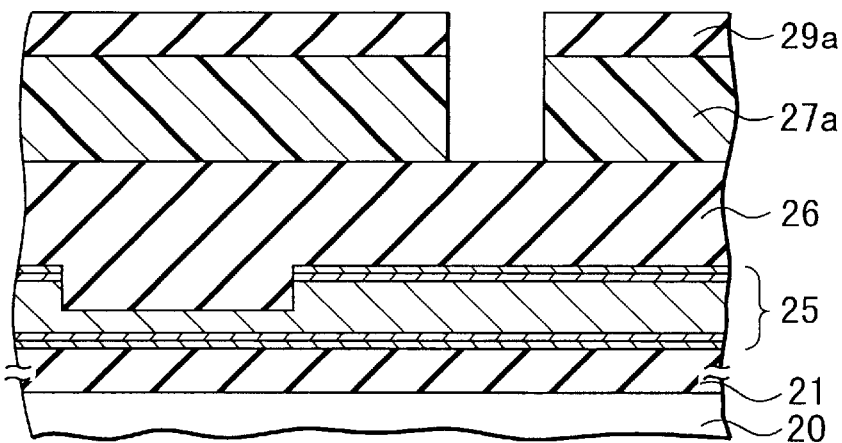
FIGS. 14A to 14C illustrate cross-sectional views illustrating another example of steps in the pattern-forming method according to this invention.

Thereafter, a magnetron type reactive ion etching apparatus was employed to etch the mask material layer 27 so as to transfer the interlayer pattern 29a to the mask material layer 27, thus forming the mask material pattern 27a as shown in FIG. 14A. The etching conditions employed herein were; 100 sccm in flow rate of source gas ($O_2$), 40 mTorr in vacuum degree, 3.0 W/cm$^2$ in exciting power density, and 30° C. in substrate temperature. The etching time was set to such that the mask material layer is over-etched by 30% in relative to the end point of etching that can be detected by a plasma emission.

Figure 14B:
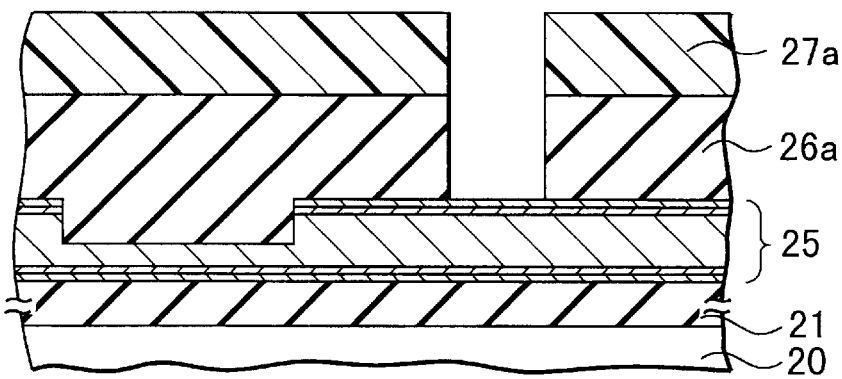
Figure 14C:
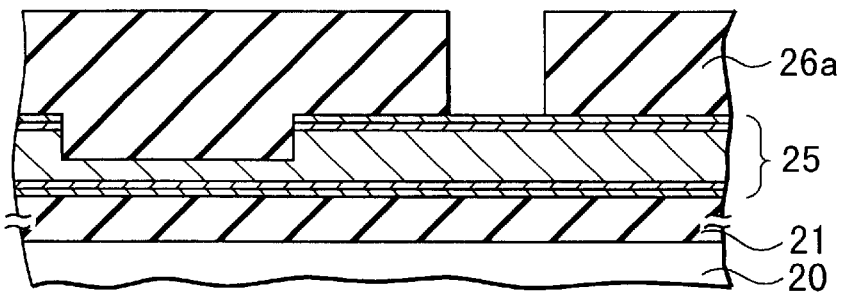

Then, the etching of the TEOS oxide film 26 was performed so as to transfer the mask material pattern 27a to the TEOS oxide film as shown in FIG. 14B, and then, the residual mask pattern was removed, thus obtaining a structure as shown in FIG. 14C. The etching and removal of the mask material layer were performed under the same conditions as those of Example (II-1).

Then, the cross-section of the TEOS oxide film pattern 26a after the removal of the mask material layer was observed by means of a scanning type electron microscope to measure the taper angle TP of the TEOS oxide film as defined in FIG. 4D, finding that it was possible to perform an excellent anisotropic working thereof as in the case of Example II-1. This may be ascribed to the fact that the mask material layer 27 employed herein according to this invention was excellent in etching resistance.

As far as there is no possibility that an alignment light can be completely intercepted, it is possible to interpose a thin film as an interlayer between the mask material layer 27 and the resist film 28 as in the case of this example.

As explained in this example, since the organic mask material to be employed in this invention can be coated normally by means of a wet coating method, and moreover, since it has a sufficient etching resistance, it now becomes possible to anisotropically work a work film in a desired manner. Additionally, the mask material layer formed according to this invention can be removed by means of ashing.

Further, by using mask material layer provided with a transparency to an alignment light, it has now become possible to form a resist pattern with a high precision in alignment.

EXAMPLE III

This example explains the third pattern-forming method.

Example III-1

This example will be explained with reference to FIGS. 5A to 5D, FIGS. 6A to 6D, FIGS. 7A to 7C and FIGS. 8A to 8C.

First of all, an $SiO_2$ film 31 having 700 nm was formed as a work film on a silicon wafer 30 by means of LPCVD method.

Then, an anti-reflective film 32 having a thickness of 90 nm was formed on the $SiO_2$ film 31 formed as a work film as shown in FIG. 5A. This anti-reflective film was formed by a method wherein 10 g of polysulfone was dissolved in 90 g of cyclohexane to prepare a solution for anti-reflective film, which was then coated on the surface of the $SiO_2$ film 31 (work film) by means of a spin-coating method and then heated by using a hot plate at a temperature of 220° C. for 90 seconds to form an anti-reflective film 32.

Then, the resist solution was coated on the anti-reflective film 32 by means of a spin-coating method, and was baked over a hot plate at a temperature of 110° C. for 90 seconds, thus forming the resist film 33 as shown in FIG. 5B. The resist solution employed in this example was a chemical amplification type positive resist wherein 9.9 g of polyvinylphenol (an inhibiting resin) having a weight average molecular weight 12,000, 30% of the hydroxyl group thereof being substituted by trimethylsilyl silane, and 0.1 g of the sulfoneimide (an acid-generating agent) were dissolved in 90 g of ethyl lactate.

The film thickness of the resist film 33 thus obtained was 150 nm.

This resist film 33 was then subjected to a patterning exposure by an irradiation of ArF excimer laser, and was baked for 90 seconds at a temperature of 110° C. by using a hot plate. The resist film 33 thus baked was then subjected to a developing treatment by using 0.21N tetramethyl ammonium hydroxide, thereby forming a 0.15 μm line-and-space pattern 33a as shown in FIG. 5C.

Thereafter, in the same manner as illustrated in the aforementioned (S1) to (S6) set forth in Example I-1, a mask material was coated on the wafer on which the resist pattern 33a had been formed in advance, thereby filling an opened space formed in the resist pattern with a mask material layer as shown in FIG. 5D.

The wafer was then heated to a temperature of 160° C. for 60 seconds by using a hot plate so as to evaporate the solvent in the mask material layer and at the same time, to decompose the solubility inhibiting group in the resist pattern. Thereafter, the mask material layer thus baked was subjected to a developing treatment by using 0.21N tetramethyl ammonium hydroxide as a developing solution, thereby removing (through dissolution) the resist pattern 33a and forming a mask material pattern 34a as shown in FIG. 6A.

According to this method, it is possible to form a reversal pattern by using a positive resist without necessitating the employment of a negative resist which is generally inferior in resolution as compared with a positive resist. Therefore, it is possible to secure a wide exposure margin.

Thereafter, a magnetron type reactive ion etching apparatus was employed to successively etch the anti-reflective film 32 and the work film 31 so as to transfer the mask material pattern 34a to the work film 31, thus forming the work film pattern 31a as shown in FIG. 6C. The etching conditions employed herein were; 30/100/150 sccm in flow rate of source gas ($CF_4/O_2/Ar$), 45 mTorr in vacuum degree, 1.5 W/cm² in exciting power density, and 30° C. in substrate temperature.

Further, the mask material pattern and the anti-reflection pattern that were left after the etching of the work film were removed by using a down-flow type asher to thereby obtain a structure as shown in FIG. 6D. The etching conditions employed herein were; 100 sccm in flow rate of source gas ($O_2$), 40 mTorr in vacuum degree, 1.5 W/cm² in exciting power density and 30° C. in substrate temperature.

After the mask material pattern and the anti-reflection pattern were removed, an etch bias which can be represented by a difference between an interval $Y_1$ of the mask material pattern 31a as defined in FIG. 6D and a width $X_1$ of the resist pattern 33a as defined in FIG. 5C (=$Y_1-X_1$) was investigated by using a scanning type electron microscope. The results thus obtained are summarized in the following Table 4.

TABLE 4

| Method of forming mask | Etching rate [nm/min.] | Etch bias [nm] |
| --- | --- | --- |
| (S1) | 48 | 3 |
| (S2) | 48 | 4 |
| (S3) | 45 | 3 |
| (S4) | 46 | 4 |
| (S5) | 47 | 4 |
| (S6) | 48 | 4 |

As shown in Table 4, the etch bias was found as small as 4 nm in every samples, which is less than the tolerance value of 15 nm, thus indicating that the work film 31 could be worked with an excellent dimension controllability.

The etching rate of the mask material layer and the $SiO_2$ film was investigated by suspending the etching of the work film in the middle thereof, the results being summarized in the aforementioned Table 4. The etching rate of the $SiO_2$ film in this case was 420 nm/min, whereas the etching rate of the mask material layer was sufficiently lower as compared with that of the $SiO_2$ film, thus making it possible to anisotropically etch the mask material layer.

Comparative Example III-1

This comparative example will be explained with reference to FIGS. 20A to 20F.

Figure 20A:
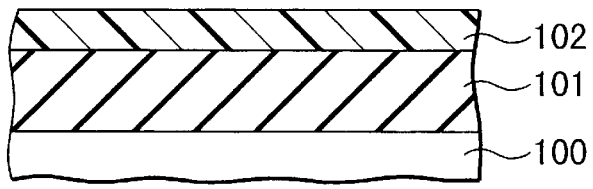
FIGS. 20A to 20F schematically illustrate the steps of forming a pattern according to the prior art.

As shown in FIG. 20A, at first, a work film 101 and an anti-reflective film were successively formed on a silicon wafer 100 in the same manner as in Example III-1.

Figure 20B:
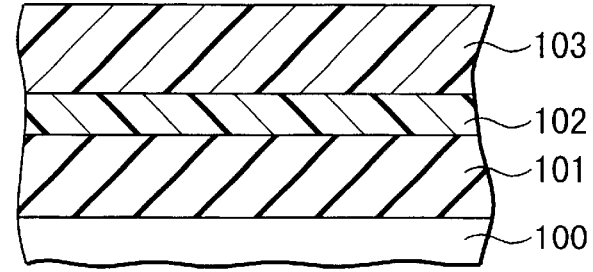

Then, in the same manner as in Example III-1, a resist film 103 was formed on the anti-reflective film 102 to form a resist film 103 as shown in FIG. 20B. The film thickness of the resist film 103 after the baking thereof was 400 nm. Thereafter, in the same manner as in Example III-1, a resist pattern 103a was formed as shown in FIG. 20C.

Figure 20C:
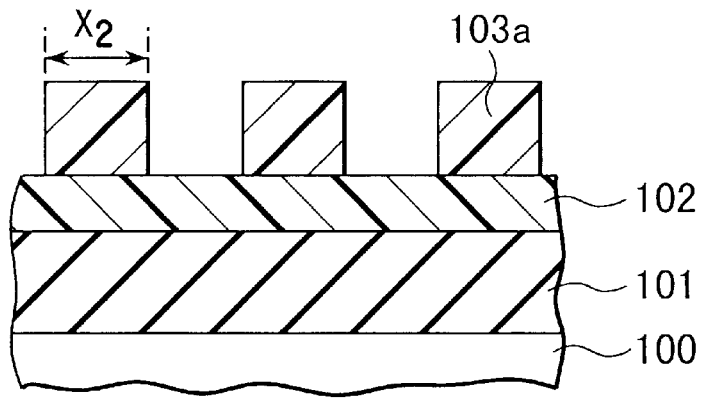
Figure 20D:
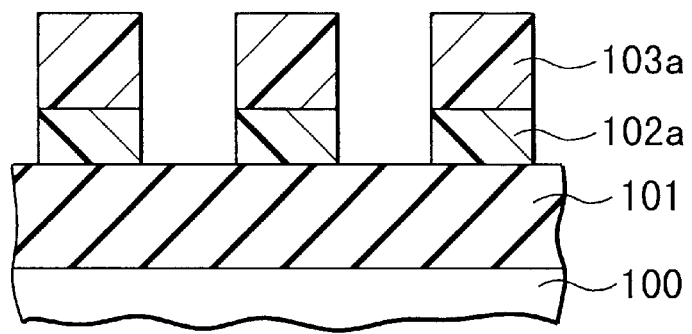
Figure 20E:
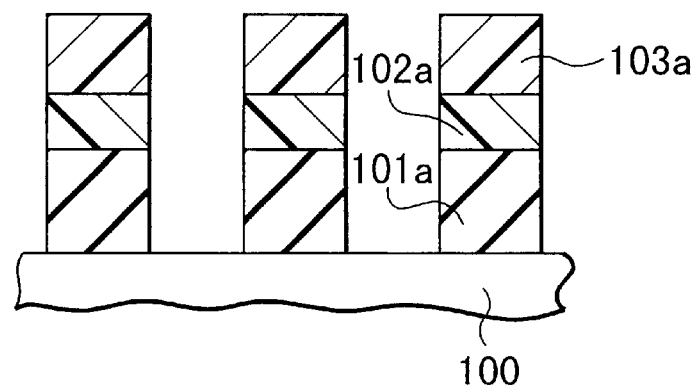

The anti-reflective film 102 was etched with this resist pattern 103a being employed as an etching mask, thereby forming an anti-reflective film pattern 102a as shown in FIG. 20D. Further, the work film 101 was etched to form a work film pattern 101a as shown in FIG. 20E.

Figure 20F:
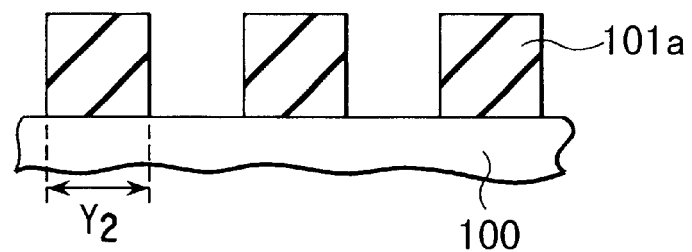

Finally, in the same manner as in Example III-1, the resist pattern and the anti-reflection pattern that were left after the etching were removed, thereby obtain a structure as shown in FIG. 20F.

After the mask material pattern and the anti-reflection pattern were removed, an etch bias which can be represented by a difference between a width $Y_2$ of the work film pattern 101a as defined in FIG. 20F and a width $X_2$ of the resist pattern 103a as defined in FIG. 20C ($=Y_2-X_2$) was investigated. As a result, the etch bias was found 18 nm, exceeding over the tolerance value of 15 nm.

When the etching resistance of the resist pattern was investigated by suspending the etching of the work film in the middle thereof, the etching rate of resist pattern was found as being 74 nm/min, thus confirming that the mask material pattern formed in Example III-1 was higher in etching resistance as compared with that of the resist pattern. Because of this, it was assumed that the work film of Example III-1 was enabled to be worked with an excellent controllability.

Example III-2

This example will be explained with reference to FIGS. 15A to 15D and FIGS. 16A to 16E.

First of all, an $SiO_2$ film 31 having 700 nm was formed as a work film on a silicon wafer 30 by means of LPCVD method.

Figure 15A:
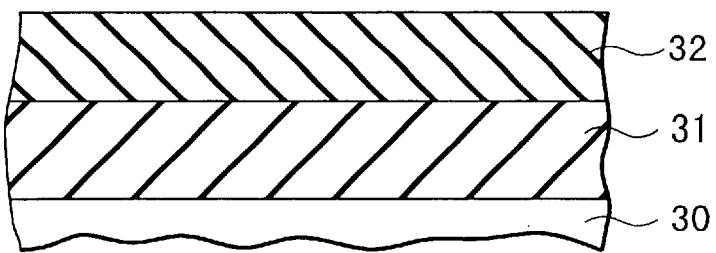
FIGS. 15A to 15D illustrate cross-sectional views illustrating another example of steps in the pattern-forming method according to this invention.

Then, an anti-reflective film 32 having a thickness of 300 nm was formed on the $SiO_2$ film 31 formed as a work film as shown in FIG. 15A. The solution of this anti-reflective film was formed by a method wherein 10 g of $WO_3$ was dissolved in 90 g of methanol to prepare a solution for anti-reflective film, which was then coated on the surface of the $SiO_2$ film 31 (work film) by means of a spin-coating method and then heated by using a hot plate at a temperature of 220° C. for 90 seconds to form an anti-reflective film 32.

Figure 15B:
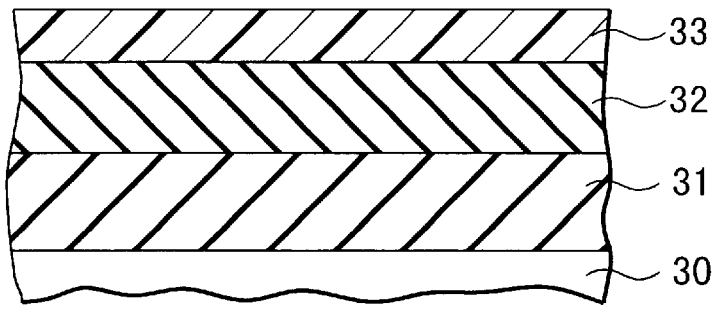

Then, a resist film 33 was formed on the surface of the anti-reflective film 32 as shown in FIG. 15B in the same manner as in Example III-1. The film thickness of the resist film 33 thus obtained was 150 nm.

Figure 15C:
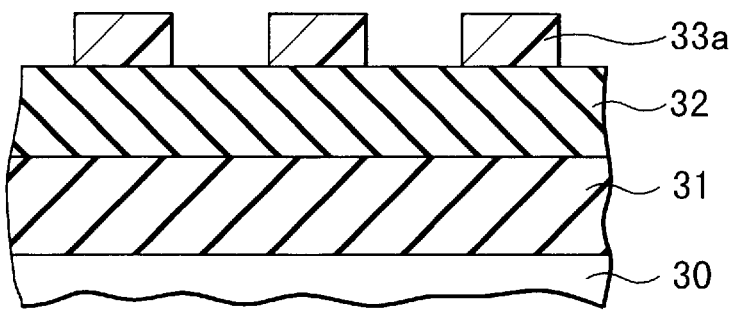

This resist film 33 was then subjected to a patterning exposure and to a developing treatment, thereby forming a 0.15 μm line-and-space pattern 33a as shown in FIG. 15C.

Figure 15D:
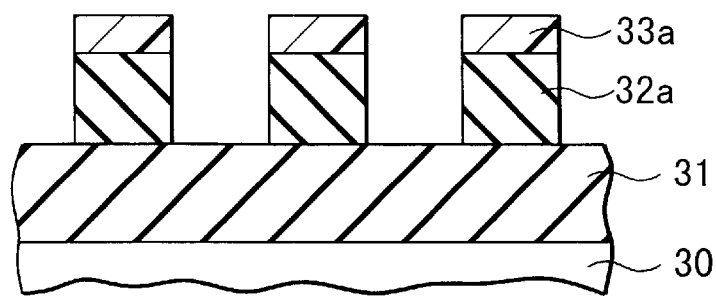

Thereafter, a magnetron type reactive ion etching apparatus was employed to etch the anti-reflective film 32 so as to transfer the resist pattern 33a to the anti-reflective film 32, thus forming an anti-reflective film pattern 32a as shown in FIG. 15D. The etching conditions employed herein were; 30/100/150 sccm in flow rate of source gas ($CF_4/O_2/Ar$), 45 mTorr in vacuum degree, 1.5 W/cm² in exciting power density, and 30° C. in substrate temperature.

As a result, the anti-reflective film 32 could be etched at a rate which was 12.0 times higher than that of the resist pattern 33a, thus making it possible to etch the anti-reflective film 32 with an excellent anisotropy even if the film thickness of the resist film 33 was reduced. Further, the resist pattern 33a and the anti-reflective film pattern 32a which were left after the etching were utilized as a matrix pattern.

Figure 16A:
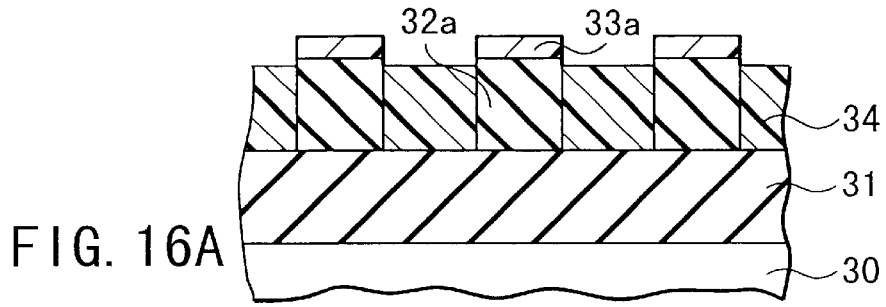
FIGS. 16A to 16E illustrate cross-sectional views illustrating another example of steps in the pattern-forming method according to this invention.
Figure 16B:
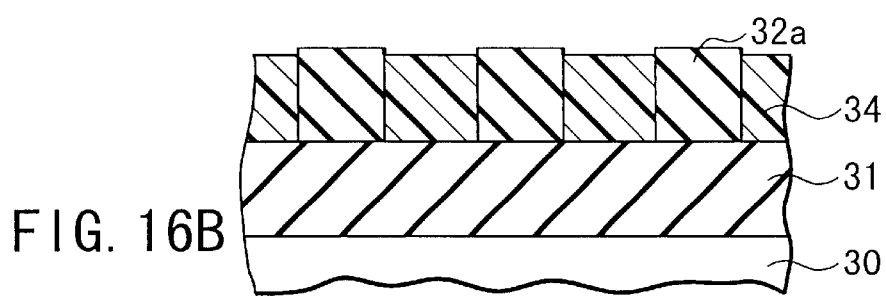

Thereafter, by means of a spin-coating method, a solution of each of the mask materials prepared according to the aforementioned (S1) to (S6) set forth in Example I-1 was coated on the wafer on which the matrix pattern consisting of a laminate structure comprising the anti-reflective film pattern 32a and the resist pattern 33a was formed in advance. As a result, an opened space formed in the matrix pattern was filled with a mask material layer as shown in FIG. 16A.

Figure 16C:
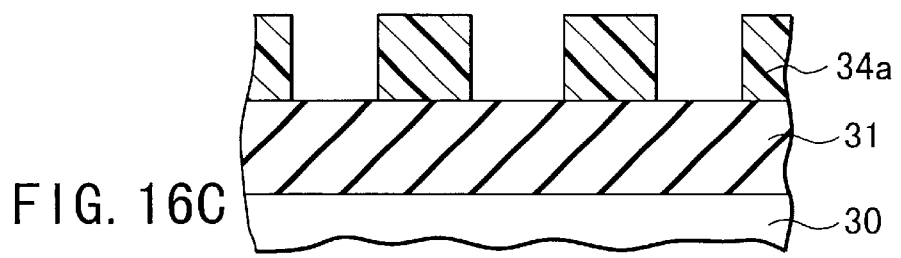

The resultant wafer was then heated to a temperature of 160° C. for 60 seconds by using a hot plate so as to evaporate the solvent in the mask material layer and at the same time, to decompose the solubility inhibiting group in the resist pattern. Thereafter, the mask material layer thus baked was subjected to a developing treatment by using 0.21N tetramethyl ammonium hydroxide as a developing solution, thereby removing (through dissolution) the resist pattern 33a and the anti-reflective film pattern 32a to form a mask material pattern 34a as shown in FIG. 16C.

According to this method, it is possible to form a reversal pattern by using a positive resist without necessitating the employment of a negative resist which is generally inferior in resolution as compared with a positive resist. Therefore, it is possible to secure a wide exposure margin. According to this example, since the mask material 34 was filled into an open space of the anti-reflective film pattern 32a having a higher film thickness as compared with that of Example III-1, it was possible to increase the film thickness of the mask material pattern 34a even if the film thickness of the resist pattern 33a was reduced.

Figure 16D:
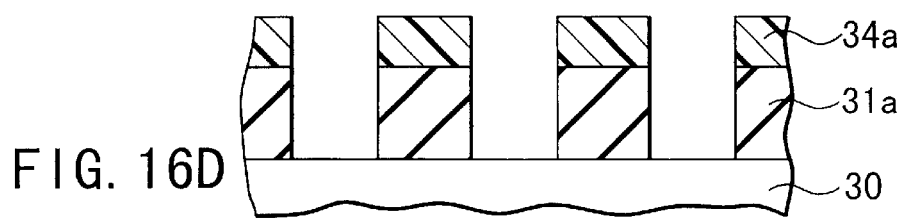

Thereafter, this mask material pattern 34a was employed as an etching mask to etch the work film 31 under the same conditions as in Example III-1 so as to transfer the mask material pattern 34a to the work film 31, thus forming the work film pattern 31a as shown in FIG. 16D.

Figure 16E:
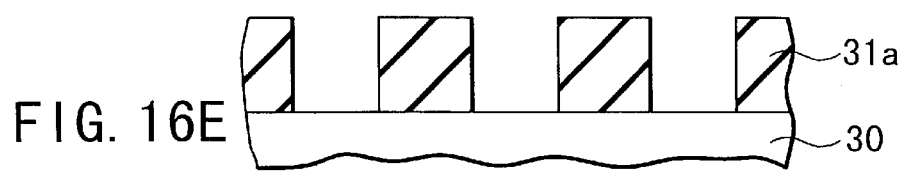

Finally, the mask material pattern 34a that was left after the aforementioned etching was removed in the same manner as employed in Example III-1 to thereby obtain a structure as shown in FIG. 16E.

When the cross-section of the work film pattern 31a was observed by using a scanning type electron microscope, it was confirmed that the work film pattern 31a was worked with a high precision as in the case of Example III-1.

Example III-3

This example will be explained with reference to FIGS. 17A to 17D, 18A to 18D and FIGS. 19A to 19E.

First of all, an $SiO_2$ film 31 having 700 nm was formed as a work film on a silicon wafer 30 by means of LPCVD method.

Figure 17A:
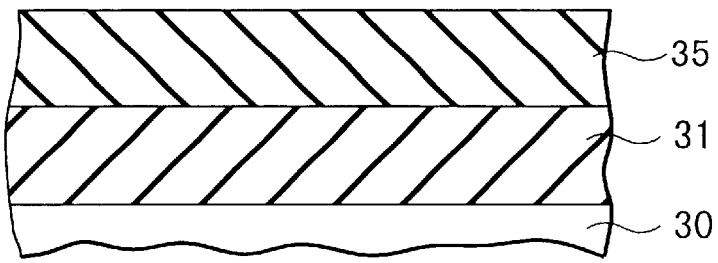
FIGS. 17A to 17D illustrate cross-sectional views illustrating another example of steps in the pattern-forming method according to this invention.

Then, a sacrificial film 35 having a thickness of 400 nm was formed on the SiO₂ film 31 formed as a work film as shown in FIG. 17A. The solution of this sacrificial film was formed by a method wherein 10 g of an organic silicone compound represented by the following chemical formula [S-2] was dissolved in 90 g of methylisobutyl ketone to prepare a solution for anti-reflective film.

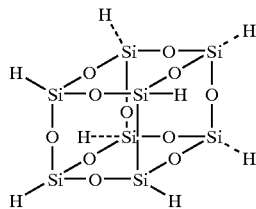
[S-2]

Figure 17B:
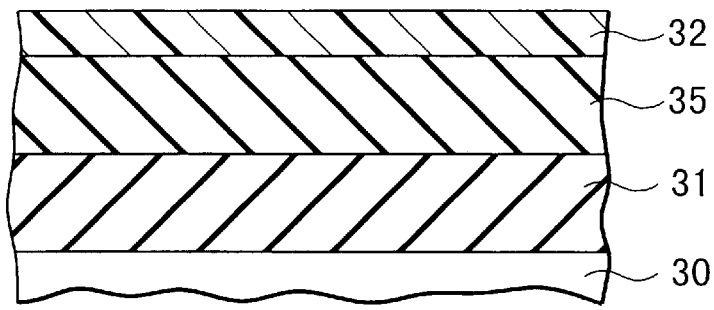
Figure 17C:
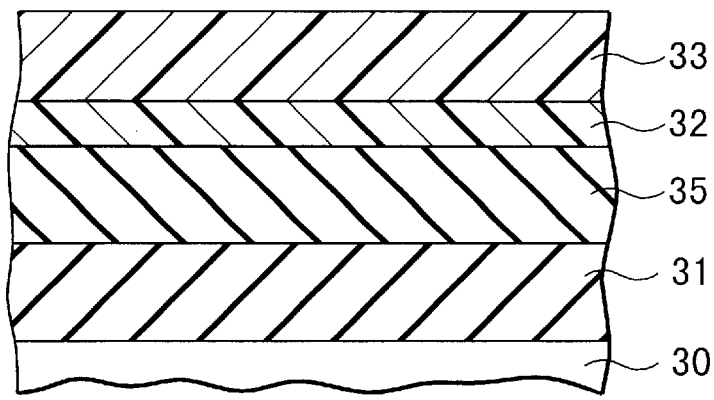

Then, an anti-reflective film 32 having a film thickness of 90 nm was formed on the surface of the sacrificial film 35 in the same manner as in Example III-1 as shown in FIG. 17B. Additionally, a resist film 33 was formed on the surface of the anti-reflective film 32 in the same manner as in Example III-2 as shown in FIG. 17C. The film thickness of the resist film 33 thus obtained was 150 nm.

Figure 17D:
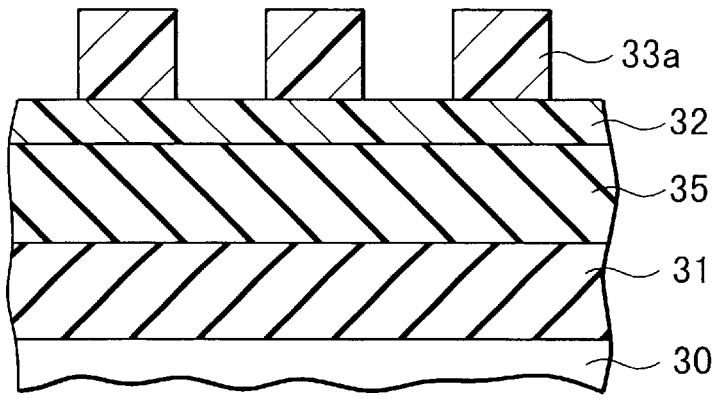

This resist film 33 was then subjected to a patterning exposure and to a developing treatment, thereby forming a 0.15 μm line-and-space pattern 33a as shown in FIG. 17D.

Figure 18A:
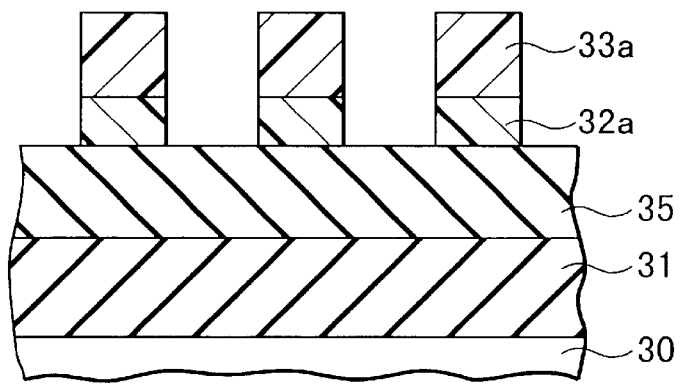
FIGS. 18A to 18D illustrate cross-sectional views illustrating another example of steps in the pattern-forming method according to this invention.
Figure 18B:
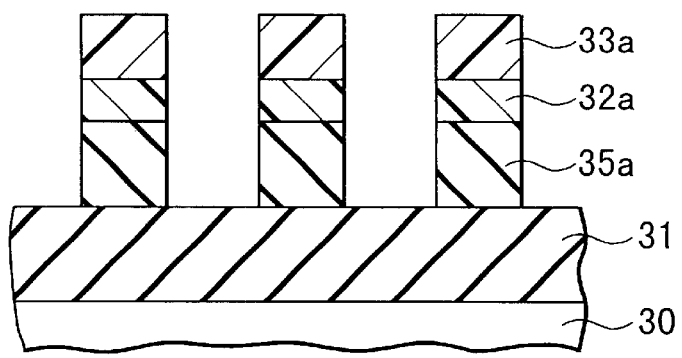

Thereafter, a magnetron type reactive ion etching apparatus was employed to successively etch the anti-reflective film 32 and the sacrificial film 35 so as to form an anti-reflective film pattern 32a and a sacrificial film pattern 35a as shown in FIG. 18B. The etching conditions employed herein were; 30/100/150 sccm in flow rate of source gas (CF₄/O₂/Ar), 45 mTorr in vacuum degree, 1.5 W/cm² in exciting power density, and 30° C. in substrate temperature.

As a result, the sacrificial film 35 could be etched at a rate which was 15.0 times higher than that of the resist pattern 33a, thus making it possible to etch the sacrificial film 35 with an excellent anisotropy even if the film thickness of the resist pattern was reduced.

The sacrificial film pattern 35a, the anti-reflective film pattern 32a and the resist pattern 33a which was left after the etching were utilized as a matrix pattern.

Figure 18C:
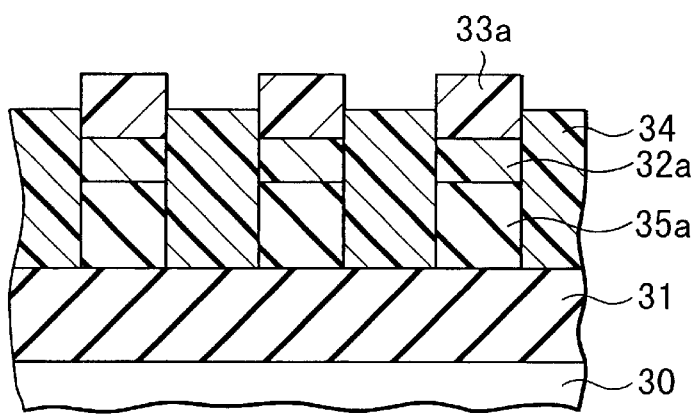

Thereafter, by means of a spin-coating method, a solution of each of the mask materials prepared according to the aforementioned (S1) to (S6) set forth in Example I-1 was coated on the wafer on which the matrix pattern consisting of a laminate structure comprising the sacrificial film pattern 35a, the anti-reflective film pattern 32a and the resist pattern 33a was formed in advance. As a result, an opened space formed in the matrix pattern was filled with a mask material layer as shown in FIG. 18C.

Figure 18D:
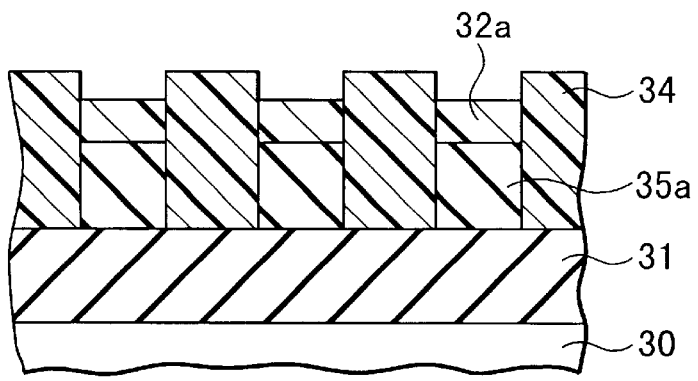

The resultant wafer was then heated to a temperature of 160° C. for 60 seconds by using a hot plate so as to evaporate the solvent in the mask material layer and at the same time, to decompose the solubility inhibiting group in the resist pattern. Thereafter, the mask material layer thus baked was subjected to a developing treatment by using 0.21N tetramethyl ammonium hydroxide as a developing solution, thereby removing (through dissolution) the resist pattern 33a as shown in FIG. 18D.

Figure 19A:
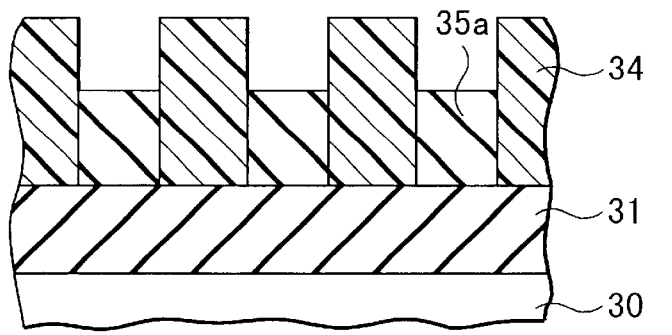
FIGS. 19A to 19D illustrate cross-sectional views illustrating another example of steps in the pattern-forming method according to this invention.
Figure 19B:
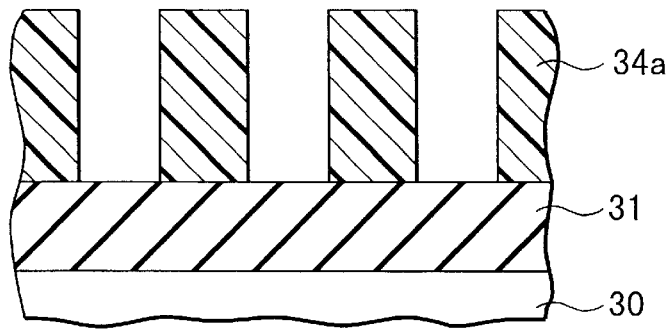

Then, under the same conditions as employed for etching the anti-reflective film in Example III-1, the anti-reflective film pattern 32a was removed with the mask material layer 34 being employed as an etching mask as shown in FIG. 19A. Further, the wafer was dipped in a dilute hydrofluoric acid solution wherein hydrofluoric acid was diluted 100 times as large volume of pure water so as to dissolve and remove the sacrificial film pattern 35a, thereby forming a mask material pattern 34a as shown in FIG. 19B.

Figure 19C:
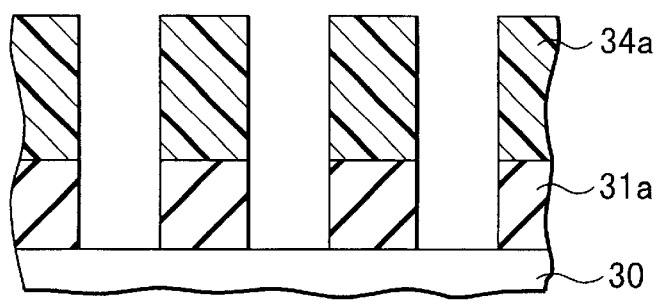

Thereafter, this mask material pattern 34a was employed as an etching mask to etch the work film 31 under the same conditions as in Example III-1 so as to transfer the mask material pattern 34a to the work film 31, thus forming the work film pattern 31a as shown in FIG. 19C.

Figure 19D:
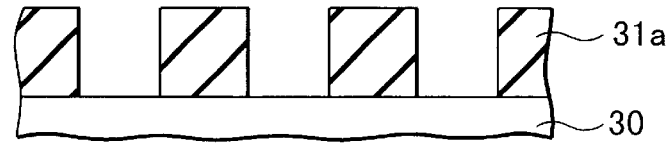

Finally, the mask material pattern 34a that was left after the aforementioned etching was removed in the same manner as employed in Example III-1 to thereby obtain a structure as shown in FIG. 19D.

When the cross-section of the work film pattern 31a was observed by using a scanning type electron microscope, it was confirmed that the work film pattern 31a was worked with a high precision as in the case of Example III-1.

EXAMPLE IV

This example explains the examples wherein the kind of mask material was changed to work a work film.

Example IV-1

1 g of poly(phenylene diacetylene) represented by the following chemical formula and having an average molecular weight of 1,000 as a compound containing conjugated multiple bonds was dissolved in 9 g of xylene to prepare a solution of mask material.

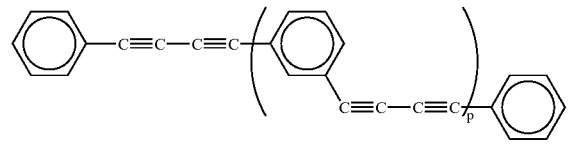

Then, a work film was worked in the same manner as employed in the aforementioned Example I-1 except that the above solution was employed for forming a mask material layer. As a result, it was possible to work the work film with an excellent anisotropy, thereby forming a work film pattern as in the case of Example I-1.

Example IV-2

First of all, 20 g of coal tar pitch (softening point: 120° C.) was dissolved in 2L of toluene to form a solution, from which insoluble matters were subsequently filtered out. Then, the filtrate was washed. Further, the resultant solution was concentrated and allowed to reprecipitate from ethanol, thereby obtaining 5 g of a refined pitch having an average molecular weight of 3,500. Then, 1 g of this refined pitch was dissolved in 9 g of cumene to prepare a solution of mask material.

Then, a work film was worked in the same manner as employed in the aforementioned Example I-1 except that the above solution was employed for forming a mask material layer. As a result, it was possible to work the work film with an excellent anisotropy, thereby forming a work film pattern as in the case of Example I-1.

Example IV-3

1 g of the refined pitch obtained from the aforementioned Example IV-2 and 0.1 g of Parkmil D (trademark, Nippon Yushi Co., Ltd.) were dissolved in 9 g of cumene to prepare a solution of mask material.

Then, a work film was worked in the same manner as employed in the aforementioned Example I-2 except that the above solution was employed for forming a mask material layer. As a result, it was possible to work the work film with an excellent anisotropy, thereby forming a work film pattern as in the case of Example I-2.

As explained above, according to the present invention, it is possible to provide a method of forming a pattern, which is featured in that it uses a mask material which can be normally coated in a wet method, has a sufficient etching resistance and is capable of being removed by means of an ashing treatment, thereby enabling a work film to be worked while assuring an excellent anisotropic etching of the work film even if the film thickness of a resist film is reduced. Additionally, according to this invention, there is provided a method of forming a pattern, which employs a mask material which is excellent in transparency to an alignment light, thereby making it possible to realize a high precision alignment in relative to an underlying pattern. Further, there is provided a method of forming a pattern, which is capable of minimizing a dimensional conversion difference on the occasion of transferring a resist pattern to a mask material layer, thus making it possible to work a work film with a high dimensional precision.

Therefore, this invention is very useful for performing a fine working in the manufacture of a semiconductor device, and hence is very valuable in industrial view point.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of forming a pattern, which comprises the steps of:

forming a mask material layer on a work film by coating a solution containing at least one kind of a network carbon polymer having a repeating unit represented by the following general formula (CP1), (CP2) or (CP4):

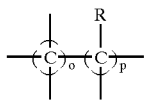
(CP1)

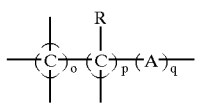
(CP2)

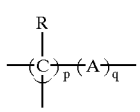
(CP4)

wherein R is a halogen atom, 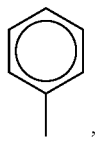,

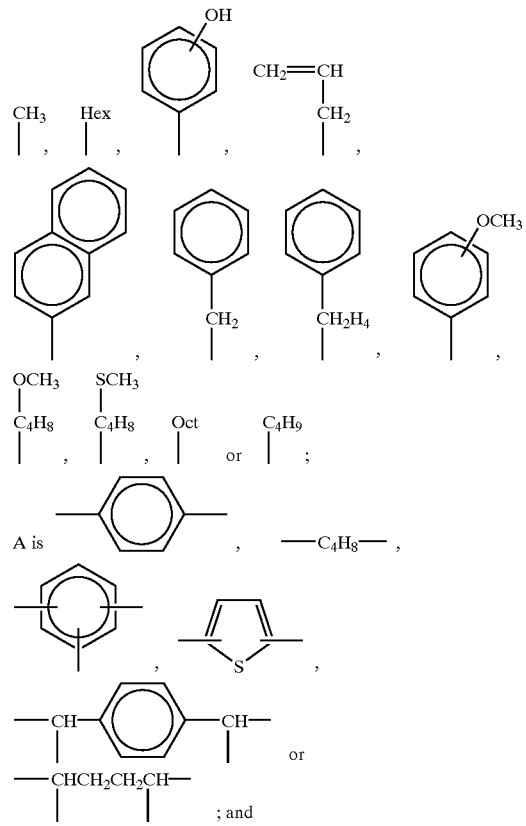

wherein o, p and q are each independently a positive integer;

forming a resist film on said mask material layer;
    forming a resist pattern by exposing said resist film to a patterning exposure light and by developing the exposed resist film;
    forming a mask material pattern by transferring said resist pattern to said mask material film; and
    forming a work film pattern by transferring said mask material pattern to said work film;
    wherein a complex index of refraction at a wavelength of said patterning exposure light of said mask material layer is in the range meeting the following relationships:
    $1.0 \leq n \leq 2.5$; and $0.05 \leq k \leq 1.0$.

2. A method of forming a pattern according to claim 1, wherein a film thickness of said mask material layer is in the range of 10 to 5,000 nm.

3. A method of forming a pattern according to claim 1, which further comprises the steps of:

forming an interlayer on said mask material layer prior to said step of forming a resist film on said mask material layer; and
    forming an interlayer pattern by transferring said resist pattern to said interlayer prior to said step of forming a mask material pattern by transferring said resist pattern to said mask material film.

4. The method of forming a pattern according to claim 3, wherein a film thickness of said interlayer is in the range of 10 to 1,000 nm.

5. A method of forming a pattern which comprises the steps of:

forming a mask material layer on a work film provided with an underlying pattern indicating a position information by coating a solution containing at least one kind of a network carbon polymer having a repeating unit represented by the following general formula (CP1), (CP2) or (CP4):

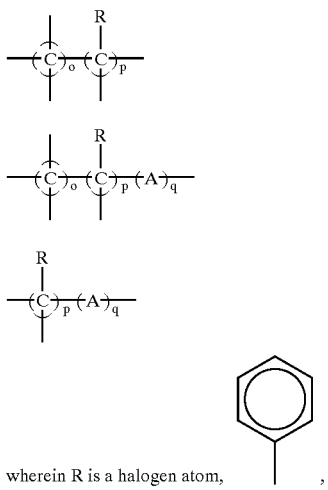

wherein R is a halogen atom,

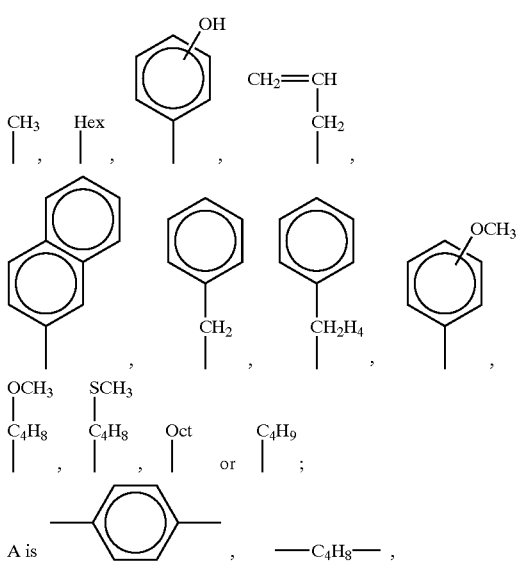

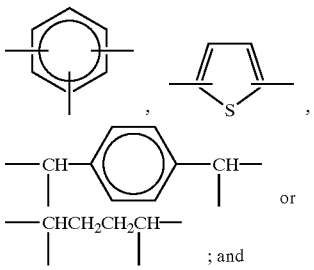

wherein o, p and q are each independently a positive integer;

forming a resist film on said mask material layer;

detecting said position information of the underlying pattern existing right below said resist film;

exposing said resist film to a patterning exposure light after correcting a position of an exposure pattern on the basis of a result of detection of said position information; and forming a resist pattern by developing said resist film which has been subjected to said patterning exposure;

wherein a birefringence index at a wavelength of said pattern exposure light of said mask material layer is in the range meeting the following relationships: $1.0 \leq n \leq 2.5$; and $0.05 \leq k \leq 1.0$.

6. A method of forming a pattern according to claim 5, wherein a film thickness of said mask material layer is in the range of 10 to 5,000 nm.

7. A method of forming a pattern according to claim 5, wherein said detection of position information is performed by using light.

8. A method of forming a pattern according to claim 5, which further comprises a step of forming an interlayer containing an inorganic atom on said mask material layer prior to said step of forming a resist film on said mask material layer.

9. The method of forming a pattern according to claim 8, wherein a film thickness of said interlayer is in the range of 10 to 1,000 nm.

10. The method of forming a pattern according to claim 8, wherein said detection of position information is performed by using light.

* * * * *